(12) United States Patent
Kim

(10) Patent No.: US 7,977,688 B2
(45) Date of Patent: Jul. 12, 2011

(54) LIGHT EMITTING DEVICE, LIGHT EMITTING SYSTEM HAVING THE SAME, AND FABRICATING METHOD OF THE LIGHT EMITTING DEVICE AND THE LIGHT EMITTING SYSTEM

(75) Inventor: YuSik Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 246 days.

(21) Appl. No.: 12/434,358

(22) Filed: May 1, 2009

(65) Prior Publication Data

US 2010/0032691 A1    Feb. 11, 2010

(51) Int. Cl.
*H01L 33/00* (2010.01)
(52) U.S. Cl. ............... 257/88; 257/89; 257/98; 257/99; 257/E33.057; 257/E33.064
(58) Field of Classification Search .............. 257/88, 257/89, 98, 99, E33.057, E33.064
See application file for complete search history.

(56) References Cited

U.S. PATENT DOCUMENTS

| | | | |
|---|---|---|---|
| 4,851,695 A * | 7/1989 | Stein | 250/551 |
| 7,842,959 B2 * | 11/2010 | Lee et al. | 257/88 |
| 2005/0146270 A1 * | 7/2005 | Ho | 313/512 |
| 2009/0023015 A1 * | 1/2009 | Hiramatsu | 428/690 |
| 2009/0267085 A1 * | 10/2009 | Lee et al. | 257/88 |
| 2010/0045154 A1 * | 2/2010 | Kim et al. | 313/1 |
| 2010/0219425 A1 * | 9/2010 | Lee | 257/88 |
| 2010/0244060 A1 * | 9/2010 | Lee et al. | 257/88 |

* cited by examiner

*Primary Examiner* — Ngan Ngo
(74) *Attorney, Agent, or Firm* — F. Chau & Associates, LLC

(57) ABSTRACT

A semiconductor device includes a first light emitting chip, the first light emitting chip having a first semiconductor layer, a second semiconductor layer, and a first active layer disposed therebetween, a second light emitting chip disposed on the first light emitting chip, the second light emitting chip having a third semiconductor layer, a fourth semiconductor layer, and a second active layer disposed therebetween, and a conductive layer disposed between the first semiconductor layer and the fourth semiconductor layer, the first semiconductor layer and the fourth semiconductor layer having different conductivity types.

16 Claims, 26 Drawing Sheets

LIGHT EMITTING DEVICE, LIGHT EMITTING SYSTEM HAVING THE SAME, AND FABRICATING METHOD OF THE LIGHT EMITTING DEVICE AND THE LIGHT EMITTING SYSTEM

CROSS REFERENCE TO RELATED APPLICATION

The present application claims priority to Korean patent applications 2008-0076549 filed on Aug. 5, 2008, the entire contents of which are incorporated herein by reference.

TECHNICAL FIELD

The present disclosure relates to a light emitting device and a method of forming the same, and more particularly to a light emitting device comprising at least two stacked light emitting diode chips and a method of forming the same.

DISCUSSION OF RELATED ART

A light emitting diode (LED) is a p-n junction diode that emits light as a result of direct radiative recombination of excess electron-hole pairs. When the LED is forward biased, electrons are able to recombine with holes and energy is released in the form of light. The color of light emitted is based on the band gap energy of the materials forming the p-n junction.

An LED can operate on direct current (DC) power or alternating current (AC) power. Light emitting efficiency of the AC LED per unit area is half of the DC LED, because in the AC power operation when two diodes are connected in parallel one of the two diodes is alternately turned on. Thus, one way to increase the light emitting efficiency in AC operated LED is to stack one LED chip over another. It would appear that an LED is always on because one of the two stacked LED chips will be on. Conventionally, LED chips are stacked one on top of another, separated by an insulating layer. To connect the stacked LED chips to an AC power source, extraneous wiring around the insulator may be needed.

A need therefore exists for an AC-operated light emitting device providing high light emitting efficiency per unit area.

SUMMARY OF THE INVENTION

Exemplary embodiments of the present invention provide a light emitting device having at least two LED chips stacked one over another. The light emitting device can operate on the AC power. The two LED chips are electrically connected through a conductive material disposed therebetween. As such, a number of electrodes and wires connecting the two LED chips can be minimized.

According to an exemplary embodiment of the present invention, a semiconductor device comprises a first light emitting chip, the first light emitting chip having a first semiconductor layer, a second semiconductor layer, and a first active layer disposed therebetween, a second light emitting chip disposed on the first light emitting chip, the second light emitting chip having a third semiconductor layer, a fourth semiconductor layer, and a second active layer disposed therebetween, and a conductive layer disposed between the first semiconductor layer and the fourth semiconductor layer, the first semiconductor layer and the fourth semiconductor layer having different conductivity types.

The semiconductor device may further comprise a first electrode disposed on the conductive layer, a second electrode disposed on the third semiconductor layer, and a third electrode disposed on the second semiconductor layer.

The second electrode and the third electrode can be electrically connected.

The semiconductor device may further comprise a substrate disposed on the second semiconductor layer.

The substrate may comprise at least one of a semiconductor material or a conductive material.

The conductive layer can be transparent.
The conductive layer can be reflective.
The third electrode can be reflective.
The third electrode may include a reflective side wall.
The third electrode can be flat.

The semiconductor device may further comprise vias disposed between the fourth semiconductor layer and the conductive layer.

The second light emitting chip is can be a vertical type light emitting chip.

The semiconductor device may further comprise a third light emitting chip including a fifth semiconductor layer, the fifth semiconductor layer disposed on the third semiconductor layer, the fifth semiconductor layer and the third semiconductor layer having different conductive types.

The semiconductor device may further comprise a third light emitting chip including a fifth semiconductor layer, the fifth semiconductor layer disposed on the third semiconductor layer, the fifth semiconductor layer and the third semiconductor layer having the same conductive type.

The first and second light emitting chips can be configured to be alternately energized on respective alternating halves of an AC waveform to emit light.

A contour of the first light emitting chip overlapping the second light emitting chip can be substantially the same as a contour of the second light emitting chip.

According to an exemplary embodiment of the present invention, a semiconductor device comprises a first pad and a second pad disposed on a first surface of a first substrate, a first light emitting chip disposed on the first surface of the first substrate, the first light emitting chip having a first semiconductor layer, a second semiconductor layer electrically connected to the second pad, and a first active layer disposed between the first and second semiconductor layers, a second light emitting chip disposed on the first light emitting chip, the second light emitting chip having a third semiconductor layer, a fourth semiconductor layer, and a second active layer disposed therebetween, a conductive layer disposed between the first semiconductor layer and the fourth semiconductor layer, the first semiconductor layer and the fourth semiconductor layer having different conductivity types, a first wire connecting the first pad and a first electrode disposed on the conductive layer, and a second wire connecting the second pad and a second electrode disposed on the third semiconductor layer.

The semiconductor device may further comprise a third electrode disposed on the second semiconductor layer.

The semiconductor device may further comprise a second substrate on the second semiconductor layer, the second substrate comprising a semiconductor material.

The conductive layer can be transparent.
The conductive layer can be reflective.
The second light emitting chip can be a vertical type emitting chip.

The first and second light emitting chips can be configured to be alternately energized on respective alternating halves of an AC waveform to emit light.

The semiconductor device may further comprise an encapsulant encapsulating the first and second light emitting chips.

The semiconductor device may further comprise a light converting material disposed in the encapsulant.

The semiconductor device may further comprise a third pad and a fourth pad disposed on a second surface of the first substrate, wherein the third pad is electrically connected to the second pad and the fourth pad is electrically connected to the first pad.

The semiconductor device may further comprise a first via disposed between the third pad and the second pad, and a second via disposed between the first pad and the fourth pad.

According to an exemplary embodiment of the present invention, a method of forming a semiconductor device comprises forming a first semiconductor layer, a second semiconductor layer, and a first active layer disposed therebetween on a first substrate, disposing a second substrate on the second semiconductor layer, removing the first substrate, forming a third semiconductor layer, a fourth semiconductor layer, and a second active layer disposed therebetween on a third substrate, disposing the first semiconductor layer on the fourth semiconductor layer, and removing the third substrate.

The method may further comprise forming a conductive layer on the first semiconductor layer.

The method may further comprise forming a bonding between the conductive layer and the fourth semiconductor layer.

The method may further comprise forming a first electrode on the conductive layer, a second electrode on the third semiconductor layer, and a third electrode on the second semiconductor layer.

The third electrode can be reflective.

The conductive layer can be transparent.

According to an exemplary embodiment of the present invention, a method of forming a semiconductor device comprises preparing a first light emitting chip having a first semiconductor layer, a second semiconductor layer, and a first active layer disposed therebetween, preparing a second light emitting chip having a third semiconductor layer, a fourth semiconductor layer, and a second active layer disposed therebetween, and disposing the first semiconductor layer on fourth semiconductor layer to be electrically connected to each other, the first semiconductor layer and the fourth semiconductor layer having different conductivity types.

The method may further comprise a conductive layer disposed on the first semiconductor layer.

The method may further comprise forming a first electrode on the conductive layer, a second electrode on the third semiconductor layer, and a third electrode on the second semiconductor layer.

The third electrode can be reflective.

The conductive layer can be transparent.

The method may further comprise preparing a first substrate having a first pad and a second pad, and connecting the second electrode and the second pad and connecting the first electrode and the first pad.

The method may further comprise encapsulating the first light emitting chip and the second light emitting chip in an encapsulant.

The method may further comprise comprising disposing a light converting material in the encapsulant.

BRIEF DESCRIPTION OF DRAWINGS

Exemplary embodiments of the present invention can be understood in more detail from the following descriptions taken in conjunction with the accompanying drawings, in which.

DESCRIPTION OF EXEMPLARY EMBODIMENTS

Figure 1A:
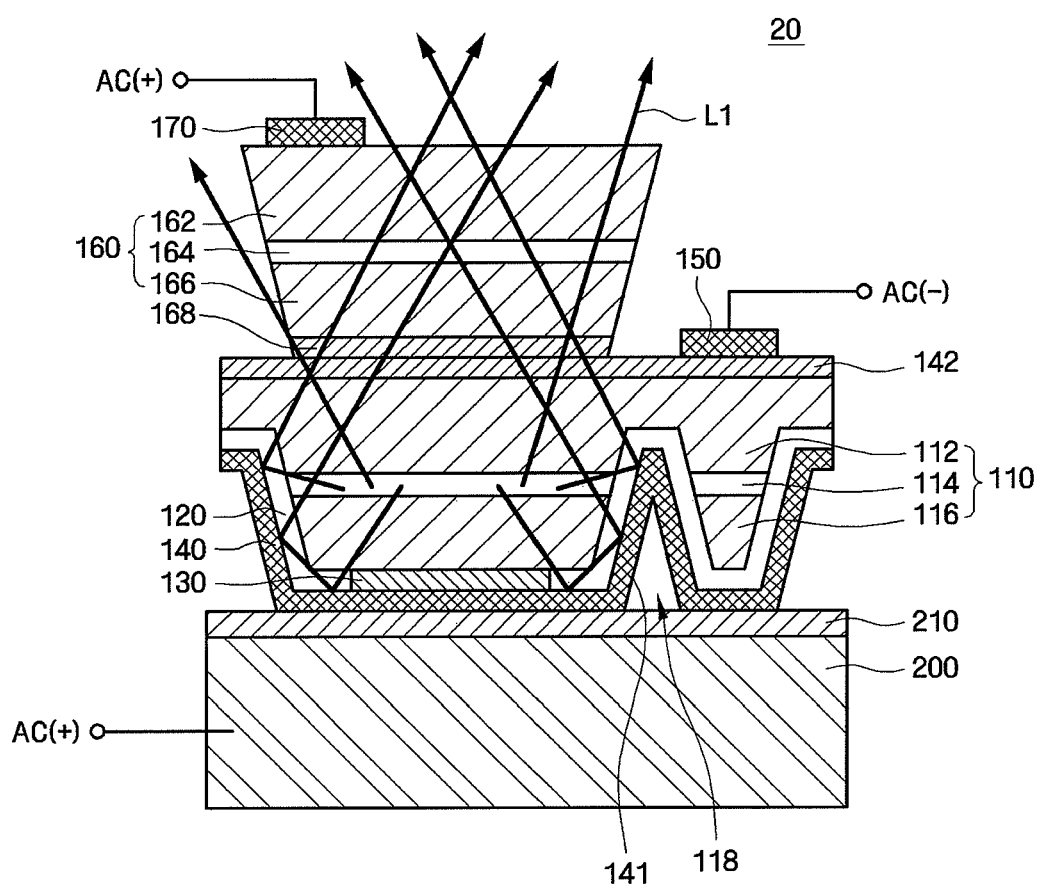
FIG. 1(A) and FIG. 1(B) show a biased light emitting device according to an exemplary embodiment of the present invention.

The present invention will now be described more fully with reference to the accompanying drawings in which example embodiments of the invention are shown. This invention may, however, be embodied in many different forms and should not be construed as limited to the exemplary embodiments set forth herein.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "vertical" refers to a direction that is substantially orthogonal to a horizontal direction.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Figure 1B:
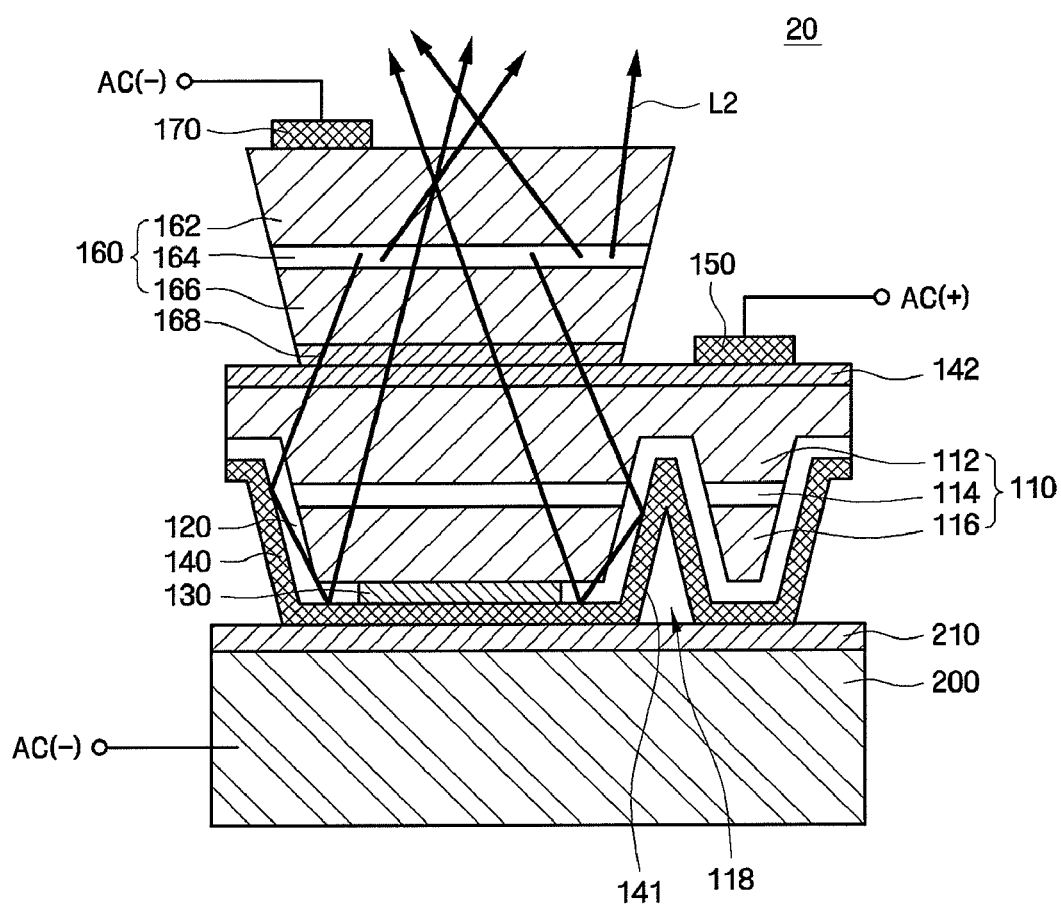

FIG. 1(A) and FIG. 1(B) show a biased light emitting device according to an exemplary embodiment of the present invention. FIG. 2 (A) and FIG. 2(B) show circuit diagrams of a biased light emitting device according to an exemplary embodiment of the present invention.

Referring to FIG. 1(A) and FIG. 1(B), a light emitting device 20 includes a first light emitting chip 110, a second light emitting chip 160, first, second and third ohmic contact layers 142, 168 and 130, first, second and third electrodes 150, 170 and 140, and a substrate 200. The first light emitting chip 110 is disposed on the substrate 200 with an intermediate layer 210 disposed therebetween. The second light emitting chip 160 is disposed on the first light emitting chip 110 with the ohmic contact layers 142, 168 therebetween.

The first light emitting chip 110 includes a first semiconductor layer 112, a second semiconductor layer 116, and a first active layer 114 disposed therebetween. The second light emitting chip 160 includes a third semiconductor layer 162, a fourth semiconductor layer 166, and a second active layer 164 disposed therebetween. In an exemplary embodiment, the first semiconductor layer 112 comprises an n-type semiconductor, the second semiconductor layer 116 comprises a p-type semiconductor, the third semiconductor layer 162 comprises an n-type semiconductor, and the fourth semiconductor layer 166 comprises a p-type semiconductor. As such, the first semiconductor layer 112 and the fourth semiconductor layer 166 have different conductivity types.

The first electrode 150 is disposed on the first ohmic contact layer 142. The second electrode 170 is disposed on the third semiconductor layer 162. The third electrode 140 is disposed on the second semiconductor layer 116 with the third ohmic contact layer 130 disposed therebetween. As such, in an exemplary embodiment, the first semiconductor layer 112 and the fourth semiconductor layer 166 having different conductivity types are electrically connected through the first and second ohmic contact layers 142, 168. The second electrode 170 and the third electrode 140 can be electrically connected.

The substrate 200 comprises, for example, a semiconductor material or a conductive material. The intermediate layer 210 can be disposed on the substrate 200. The intermediate layer 210 can comprise, for example, at least one of Au, Ag, Pt, Ni, Cu, Sn, Al, PB, Cr, or Ti. The third electrode 140 can be disposed on the intermediate layer 210. The third ohmic contact layer 130 can be disposed on the third electrode 140. The second semiconductor layer 116 can be disposed on the third ohmic contact layer 130 and an insulator 120.

In an exemplary embodiment, a conductive layer including the first and second ohmic contact layers 142 and 168 can be transparent. Alternatively, the first and second ohmic contact layers 142 and 168 can be reflective. In an exemplary embodiment, the third electrode 140 can be reflective. The third electrode 140 can include a reflective sidewall 141. The reflective sidewall 141 is inclined to increase the light emission of the light emitting device 20. A groove 118 can be formed due to the inclined reflective sidewall 141. In an exemplary embodiment, the third electrode 140 can have a high reflectivity to further increase the light emission. The reflective sidewall 141 can be omitted according to an exemplary embodiment of the present invention. As such, in an exemplary embodiment, the third electrode 140 can be flat with respect to the major axis of the substrate 200.

In an exemplary embodiment, the second light emitting chip 160 can be a vertical type structure, and the first light emitting chip 110 can be a vertical, lateral or flip type structure. In an exemplary embodiment, the second light emitting chip 160 and the first light emitting chip 110 disposed under and overlapping the second light emitting chip 160 have a substantially same contour.

Referring to FIGS. 1(A), 1(B), 2(A) and 2(B), the first and second light emitting chips 110, 160 are configured to be alternately energized on respective alternating halves of an AC waveform to emit light.

Figure 2A:
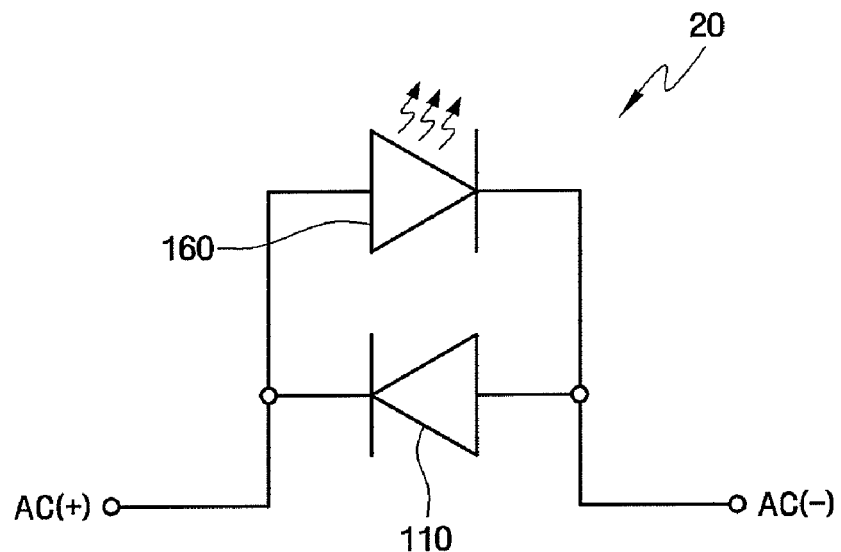
FIG. 2 (A) and FIG. 2(B) show a circuit diagram of a biased light emitting device according to an exemplary embodiment of the present invention.
Figure 2B:
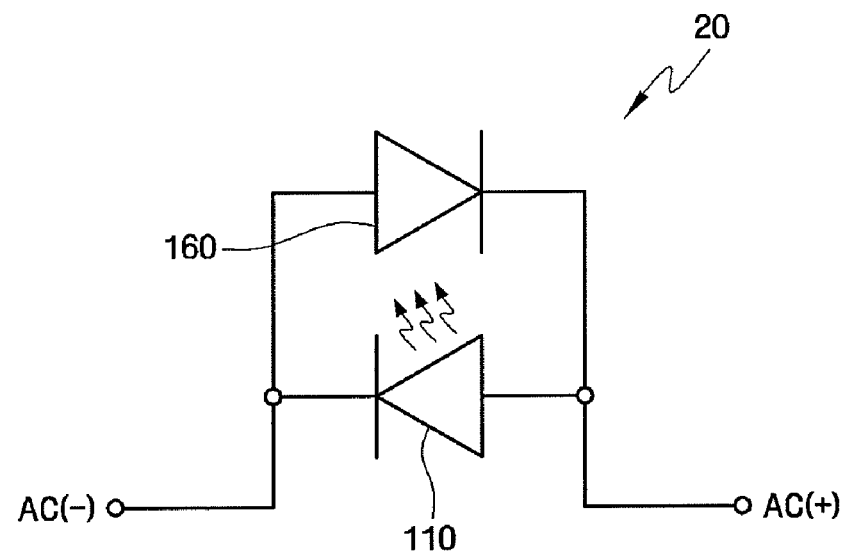

Referring to FIGS. 1(A) and 2(A), the substrate 200 and the second electrode 170 have a same potential. For example, a negative voltage (−) is applied to the first electrode 150, and a positive voltage (+) is applied to the substrate 200 and the second electrode 170. As such, the first light emitting chip 110 is forward biased and the second light emitting chip 160 is reversed biased. Thus, only the first light emitting chip 110 turns on and emits light L1. The third electrode 140 can reflect light generated from the first active layer 114 of the first light emitting chip 110. The reflected light from the third electrode 140 and directly incident light from the first active layer 114 can be emitted to the outside of the light emitting device 20 through the first and second ohmic contact layers 142, 168 when the ohmic contact layers 142, 168 are transparent.

Referring to FIGS. 1(B) and 2(B), the substrate 200 and the second electrode 170 have a same potential. For example, a positive voltage (+) is applied to the first electrode 150, and a negative voltage (−) is applied to the substrate 200 and the second electrode 170. As such, the second light emitting chip 160 is forward biased and the first light emitting chip 110 is reverse biased. Thus, only the second light emitting chip 160 turns on and emits light L2. The third electrode 140 can reflect light generated from the second active layer 164 of the second light emitting chip 160. The reflected light from the third electrode 140 and directly incident light from the second active layer 164 can be emitted to the outside of the light emitting device 20. The reflected light can transmit through the first and second ohmic contact layers 142, 168 when the ohmic contact layers 142, 168 are transparent.

Figure 3:
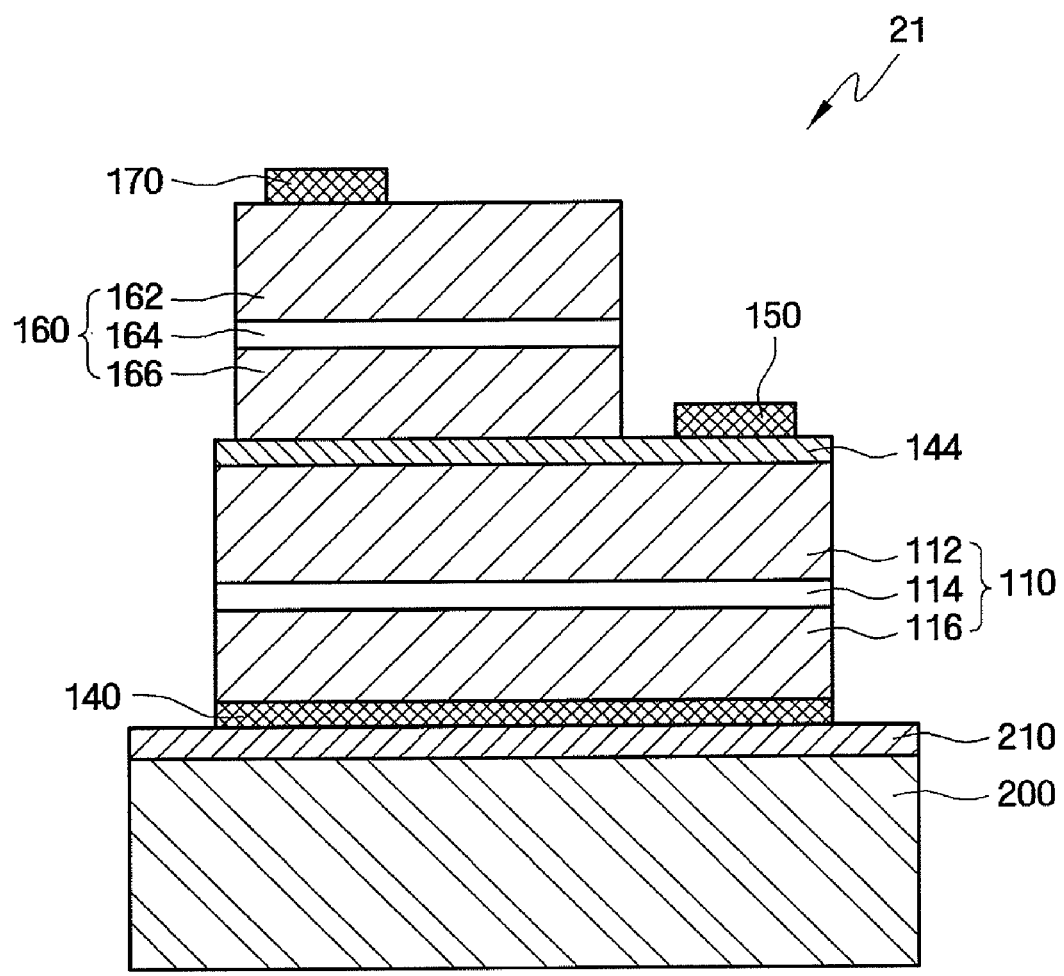
FIG. 3 shows a light emitting device according to an exemplary embodiment of the present invention.

FIG. 3 shows a light emitting device 21 according to an exemplary embodiment of the present invention. Referring to FIG. 3, the second light emitting chip 160 is disposed on a conductive layer 144. The first electrode 150 can be disposed on the conductive layer 144. In an exemplary embodiment, the third electrode 140 is flat. That is, the third electrode 140 does not have an inclined side wall. As such, light generated from the first light emitting chip 110 can be escaped in a horizontal direction. When the conductive layer 144 is transparent, light generated from the second light emitting chip 160 can transmit through the conductive layer 144 and can be reflected by the third electrode 140. When the conductive layer 144 is reflective, light generated from the second light emitting chip 160 can be reflected by the conductive layer 144.

Figure 4:
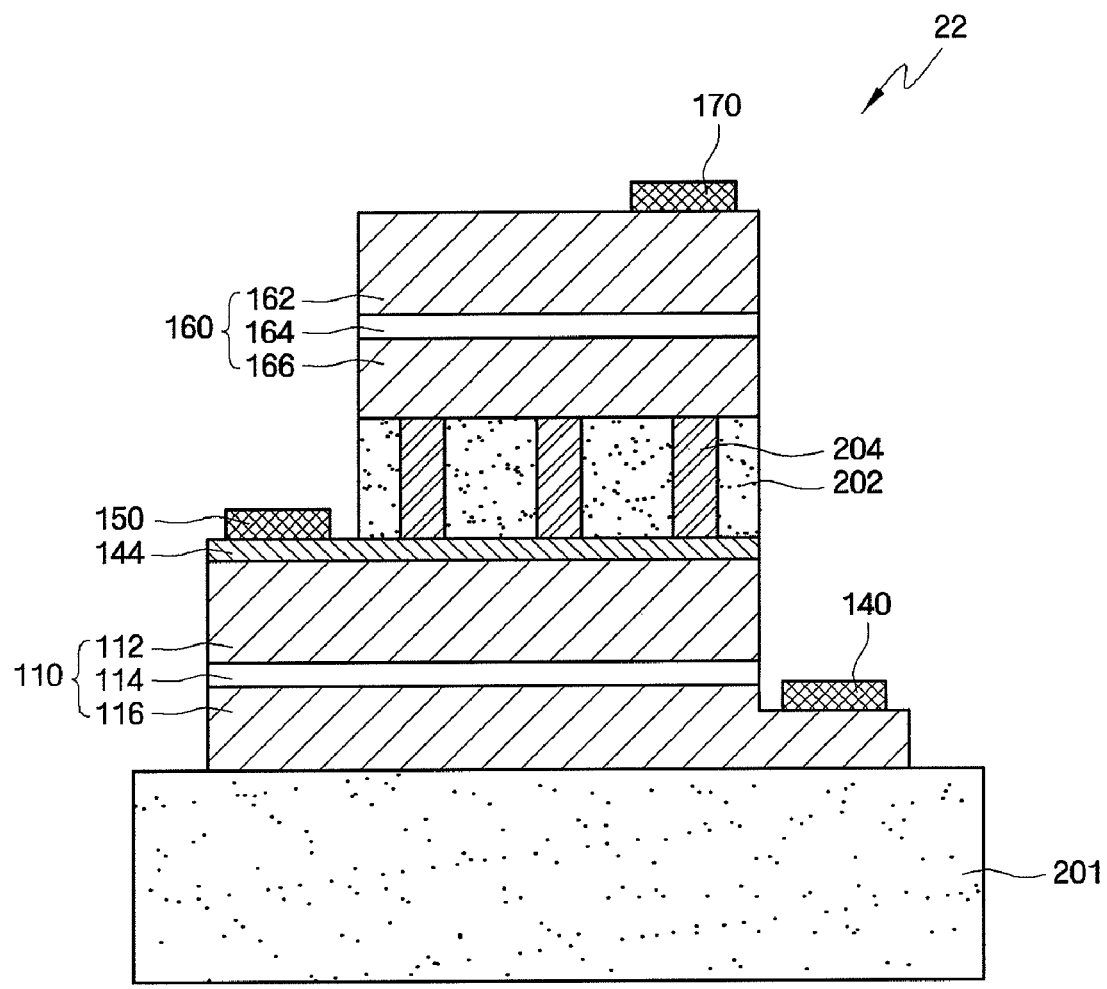
FIG. 4 shows a light emitting device according to an exemplary embodiment of the present invention.

FIG. 4 shows a light emitting device 22 according to an exemplary embodiment of the present invention. Referring to FIG. 4, the first light emitting chip 110 is disposed on a first substrate 201, and the conductive layer 144 is disposed on the first light emitting chip 110. The second light emitting chip 160 is disposed on a second substrate 202. A plurality of through vias 204 are disposed in the second substrate 202. As such, the fourth semiconductor layer 166 can be electrically connected to the conductive layer 144 through the through vias 204 filled with a conductive material. The first light emitting chip 110 includes the first semiconductor layer 112, the first active layer 114 and the second semiconductor layer 116. The second semiconductor layer 116 can be disposed on the first substrate 201. The substrates 201, 202 may comprise a sapphire ($Al_2O_3$), ZnO or SiC. In an exemplary embodiment, a reflective layer can be disposed between the second semiconductor layer 116 and the first substrate 201. The first electrode 150 is disposed on the conductive layer 144. The second electrode 170 is disposed on the third conductive layer 162. The third electrode 140 is disposed on an edge of the second semiconductor layer 116. As such, in this exemplary embodiment, the second light emitting chip 160 is a vertical type, and the first light emitting chip 110 is a lateral type.

Figure 5:
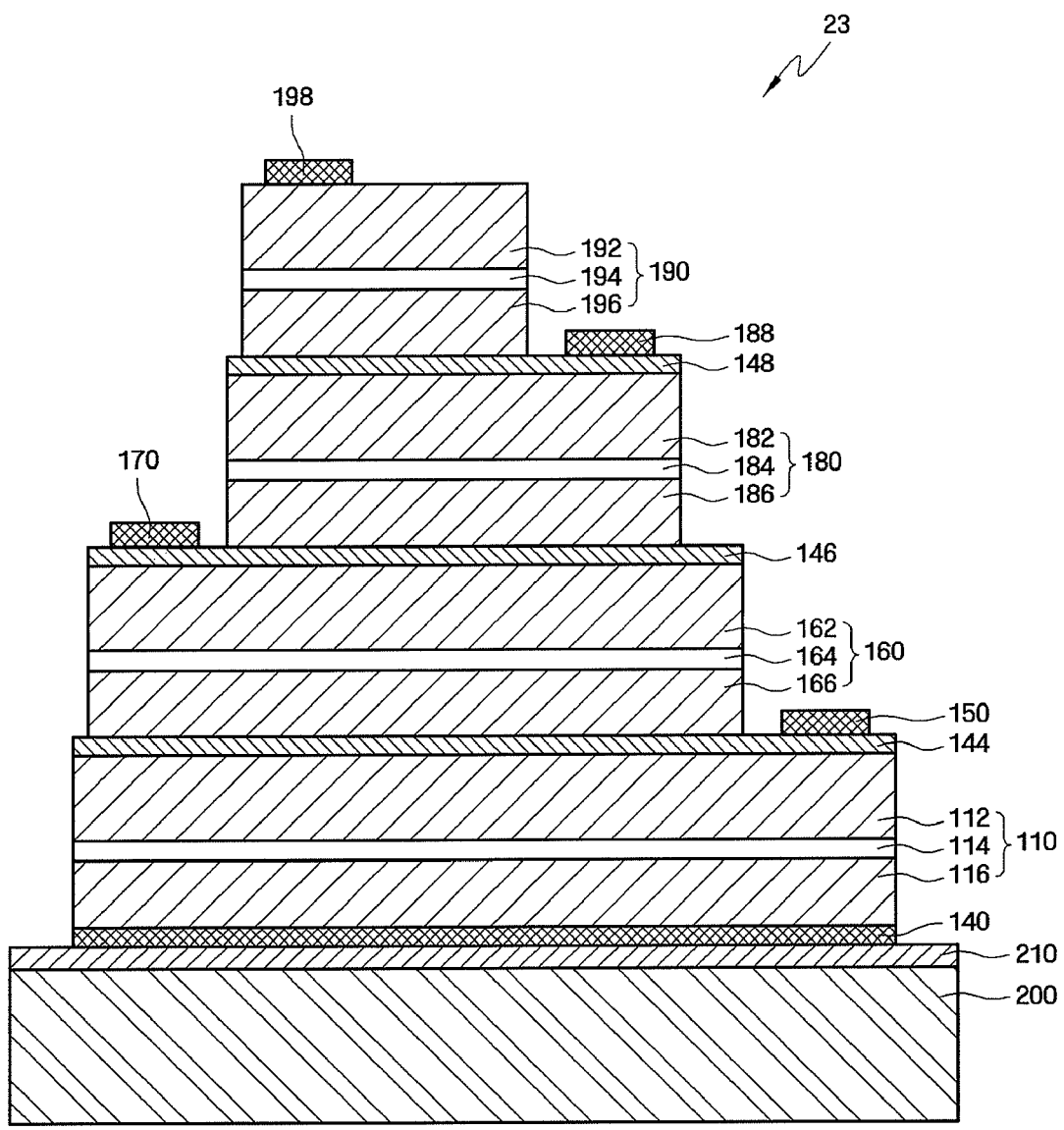
FIG. 5 shows a light emitting device according to an exemplary embodiment of the present invention.
Figure 6:
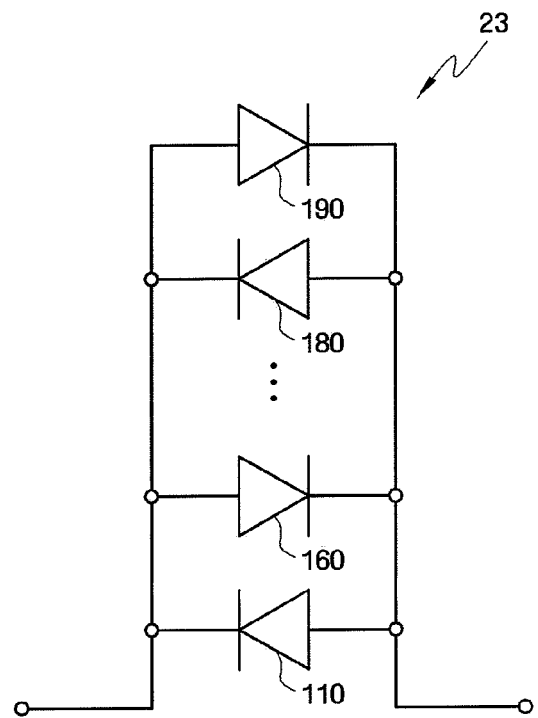
FIG. 6 shows a circuit diagram of a light emitting device according to an exemplary embodiment of the present invention.

FIG. 5 shows a light emitting device 23 according to an exemplary embodiment of the present invention. FIG. 6 shows a circuit diagram of a light emitting device according to an exemplary embodiment of the present invention. Referring to FIGS. 5 and 6, a third light emitting chip 180 and a fourth light emitting chip 190 are stacked on the first and second light emitting chips 110, 160. The third light emitting chip 180 includes a fifth semiconductor layer 186, a third active layer 184, and a six semiconductor layer 182. The fifth semiconductor layer 186 is disposed on the third semiconductor layer 162 with a second conductive layer 146 disposed therebetween. In an exemplary embodiment, the fifth semiconductor layer 186 and the third semiconductor layer 162 have different conductive types. Alternatively, the fifth semiconductor layer 186 and the third semiconductor layer 162 have a same conductive type.

The fourth light emitting chip 190 includes a seventh semiconductor layer 192, a fourth active layer 194, and an eighth semiconductor layer 196. The seventh semiconductor layer 192 is disposed on the eighth semiconductor layer 196 with the fourth active layer 194 disposed therebetween. The eighth semiconductor layer 196 contacts a third conductive layer 148 disposed thereunder. The third conductive layer 148 is disposed on and contacts the sixth semiconductor layer 182. The sixth semiconductor layer 182 is disposed on the fifth semiconductor layer 186 with the third active layer 184 disposed therebetween. The fifth semiconductor layer 186 is disposed on and contacts the second conductive layer 146. The second conductive layer 146 is disposed on and contacts the third semiconductor layer 162. The third semiconductor layer 162 is disposed on the fourth semiconductor layer 166 with the second active layer 164 disposed therebetween. The fourth semiconductor layer 166 is disposed on and contacts the first conductive layer 144. The first conductive layer 144 is disposed on and contacts the first semiconductor layer 112. The first semiconductor layer 112 is disposed on the second semiconductor layer 116 with the first active layer 114 disposed therebetween. The second semiconductor layer 116 is disposed on and contacts the third electrode 140. The third electrode 140 is disposed on and contacts the intermediate layer 210. The intermediate layer 210 is disposed on and contacts the substrate 200.

The first electrode 150 is disposed on the first conductive layer 144. The second electrode 170 is disposed on the second conductive layer 146. The third electrode 140 can be disposed between the second semiconductor layer 116 and the intermediate layer 210. The fourth electrode 188 can be disposed on the third conductive layer 148. The fifth electrode 198 can be disposed on the seventh semiconductor layer 192. In an exemplary embodiment, the first, third, fifth and the eighth semiconductor layers 112, 162, 186 and 196 can be n-type semiconductor layers, and the second, fourth, sixth and seventh semiconductor layers 116, 166, 182, and 192 can be p-type semiconductor layers.

Referring to FIG. 6, n numbers of luminous diodes can be stacked according to an exemplary embodiment of the present invention. A first group for light emitting may include light emitting chips 110 and 180, and a second group for light emitting may include light emitting chips 160 and 190. When a DC bias is applied, the first group or the second group can turn on. That is, in an exemplary embodiment, the light emitting device 23 can be DC biased.

In an exemplary embodiment, a combined luminous area of the first and fourth light emitting chips 110, 190 can be substantially same with a combined luminous area of the second and third light emitting chips 160, 180. Accordingly, a uniform light emitting intensity can be produced.

Figure 7A:
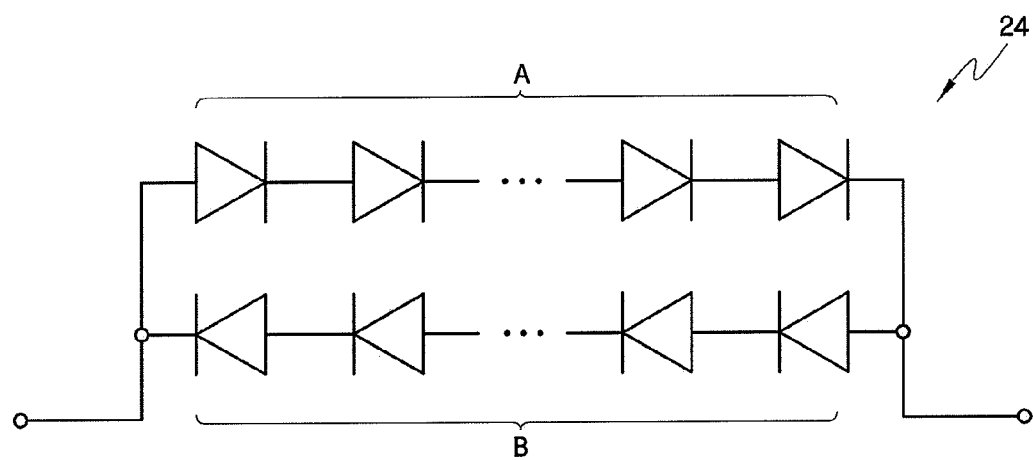
FIGS. 7(A), 7(B) and 7(C) show circuit diagrams of light emitting devices according to exemplary embodiments of the present invention.
Figure 7B:
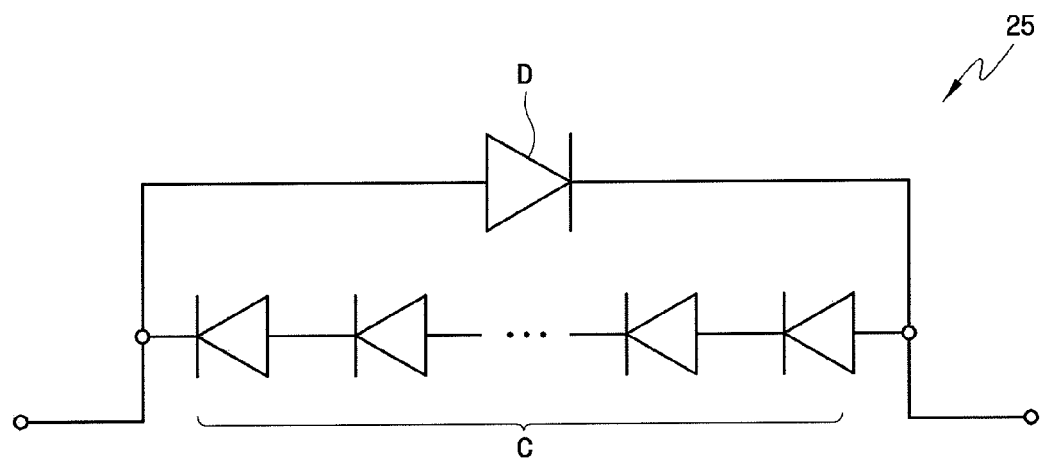
Figure 7C:
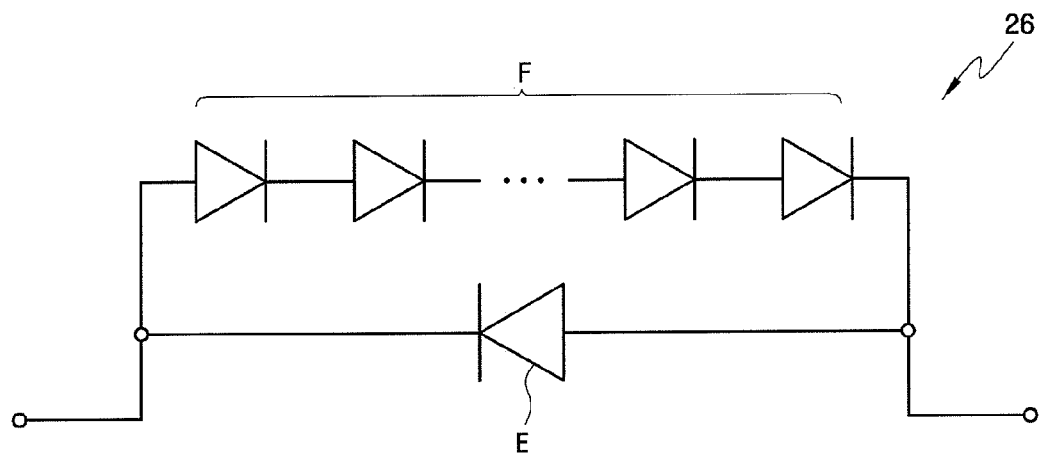

FIGS. 7(A), 7(B) and 7(C) show circuit diagrams of light emitting devices according to exemplary embodiments of the present invention. Referring to FIGS. 7(A), a light emitting device 24 includes a first luminous diode group A including a plurality of sub luminous diodes, and second luminous diode group B including a plurality of sub luminous diodes. Referring to FIG. 7(B), a light emitting device 25 includes a first luminous diode group C including a plurality of sub luminous diodes and a second luminous diode D. Referring to FIG. 7(C), a light emitting device 26 includes a first light emitting diode E and a second light emitting diode group F including a plurality of sub luminous diodes. As such, multiple light emitting diode chips can be employed according to exemplary embodiments of the present invention.

Figure 8:
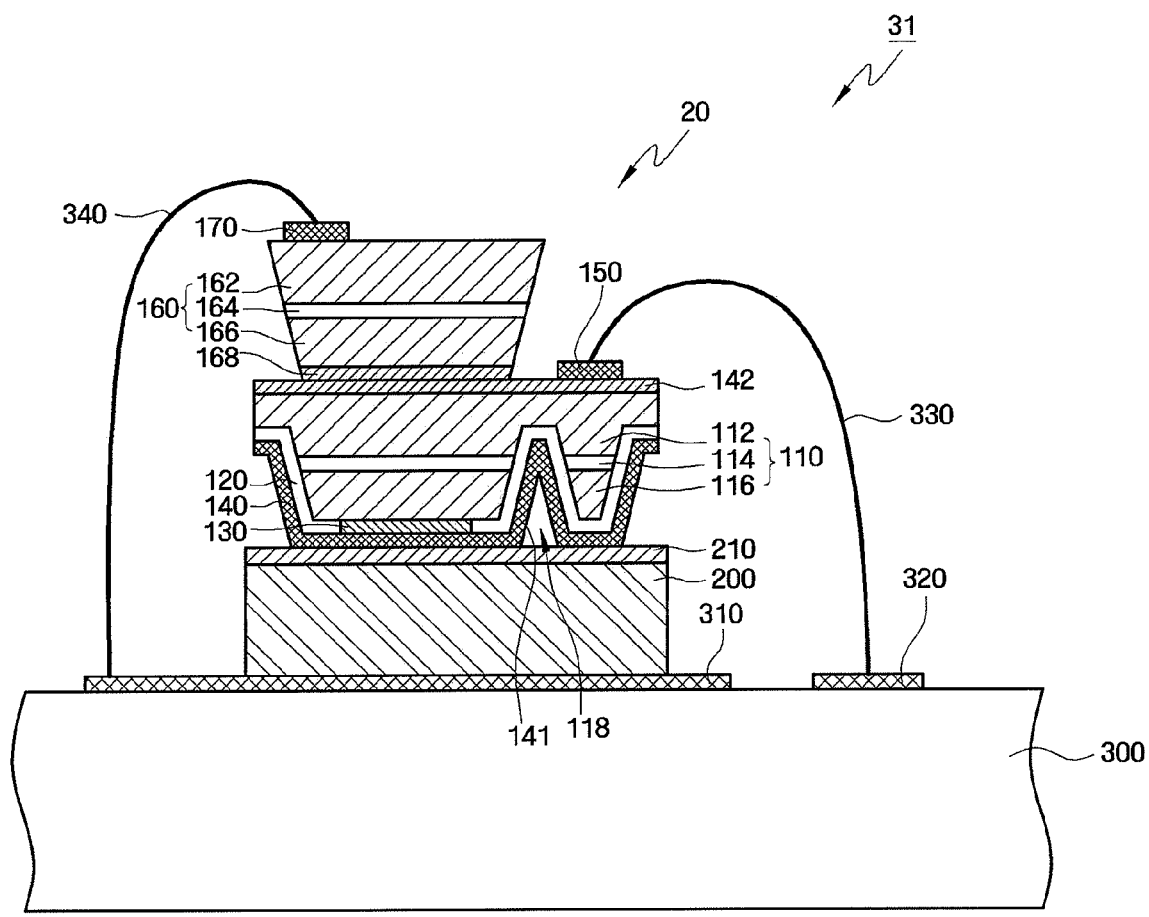
FIG. 8 shows a semiconductor package according to an exemplary embodiment of the present invention.

FIG. 8 shows a semiconductor package according to an exemplary embodiment of the present invention. Referring to FIG. 8, a semiconductor package 31 includes the light emitting device 20, a substrate 300 such as a printed circuit board (PCB), a first conductive pad 320, a second conductive pad 310, a first wire 330, and a second wire 340. The first conductive pad 320 and the second conductive pad 310 are disposed on the substrate 300. The first wire 330 connects the first conductive pad 320 and the first electrode 150 disposed on the conductive layer 142. The second wire 340 connects the second contact pad 310 and the second electrode 170 disposed on the third semiconductor layer 162.

Figure 9:
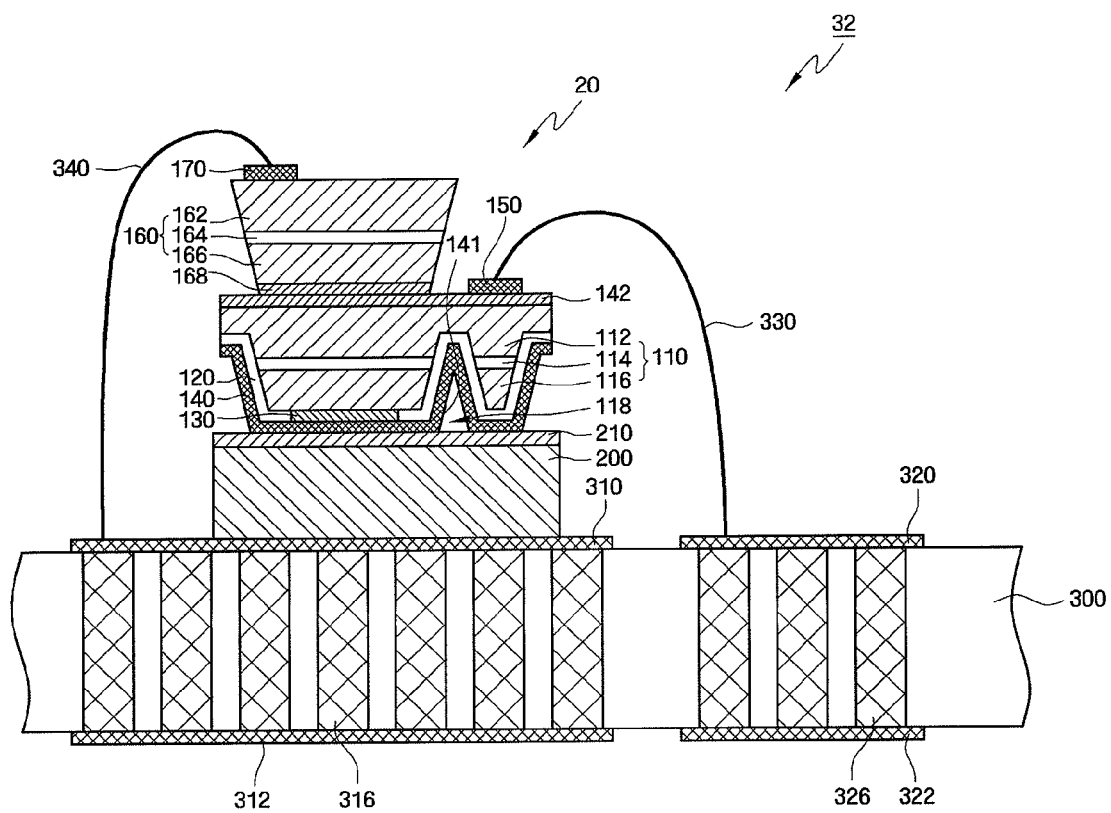
FIG. 9 shows a semiconductor package according to an exemplary embodiment of the present invention.

FIG. 9 shows a semiconductor package according to an exemplary embodiment of the present invention. Referring to FIG. 9, a semiconductor package 32 includes the light emitting device 20, the substrate 300 such as the PCB, the first conductive pad 320, the second conductive pad 310, the third conductive pad 312, the fourth conductive pad 322, the first wire 330 and the second wire 340. The substrate 300 comprises a plurality of first vias 316 disposed between the second conductive pad 310 and the third conductive pad 312, and a plurality of second vias 326 disposed between the first conductive pad 320 and the fourth conductive pad 322. The first and second conductive pads 320 and 310 are disposed on a first surface of the substrate 300, and the third and fourth conductive pads 312 and 322 are disposed on a second surface of the substrate 300. The first pad 320 can be electrically connected to the fourth pad 322 through the second vias 326, and the second pad 310 can be electrically connected to the third pad 312 through the first vias 316. The first and second vias 316, 326 can be a thermal path and/or a conductor according to an exemplary embodiment of the present invention.

Figure 10:
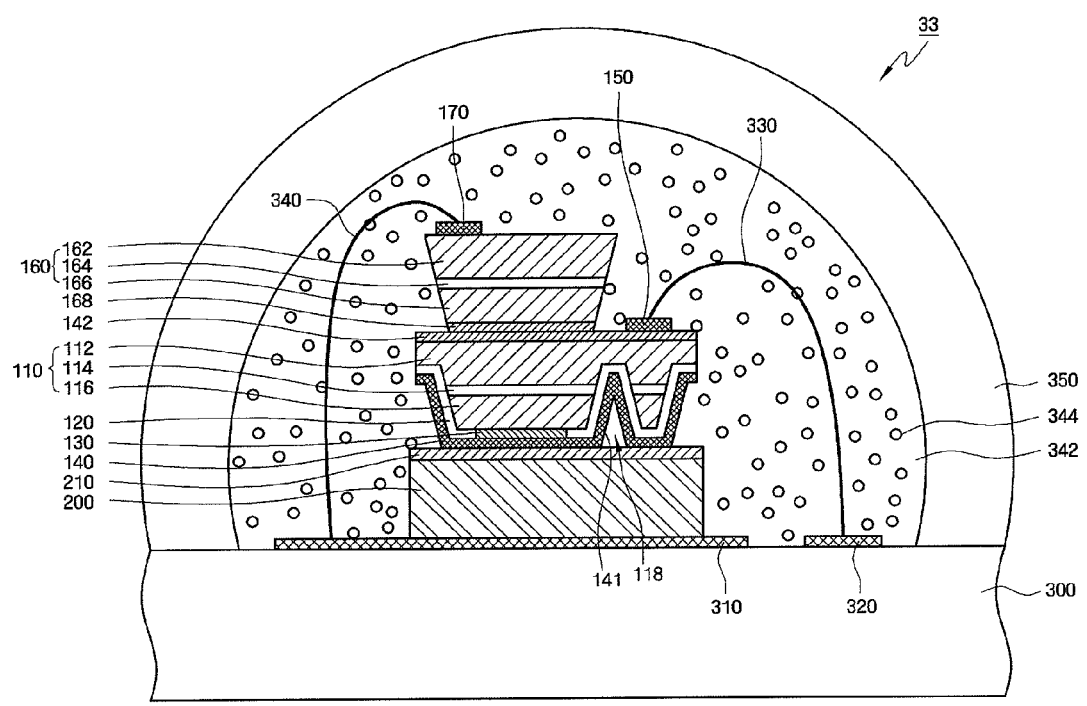
FIG. 10 shows a luminous package according to an exemplary embodiment of the present invention.

FIG. 10 shows a luminous package according to an exemplary embodiment of the present invention. Referring to FIG. 10, a luminous package 33 includes the semiconductor package 31 encapsulated by a first encapsulant 342. A light converting material such as, for example, phosphor 344 can be disposed in the first encapsulant 342. In an exemplary embodiment, the phosphor 344 can be dispersed substantially evenly throughout the first encapsulant 342. A second encapsulant 350 can be disposed on the first encapsulant 342. The phosphor 344 can convert a portion of light generated from the first and second light emitting chips 110 and 160. For example, white light can be generated from the luminous package 33 when the semiconductor package 31 generates blue light and the phosphor 344 comprises a yellow fluorescent material. In an exemplary embodiment, red phosphor can be included to increase a Color Rendering Index (CRI). When the semiconductor package 31 generates Ultraviolet (UV) light, the phosphor 344 can comprise an RGB fluorescent material. The second encapsulant 350 can prevent the phosphor 344 from damage caused by, for example, moisture. The first and second encapsulant can be, for example, an epoxy, silicone, rigid silicone, urethane, oxethane, acryl, poly-carbonate, and polymide. The phosphor 344 may comprise, for example, a nitride/oxide material activated by lanthanide.

Figure 11:
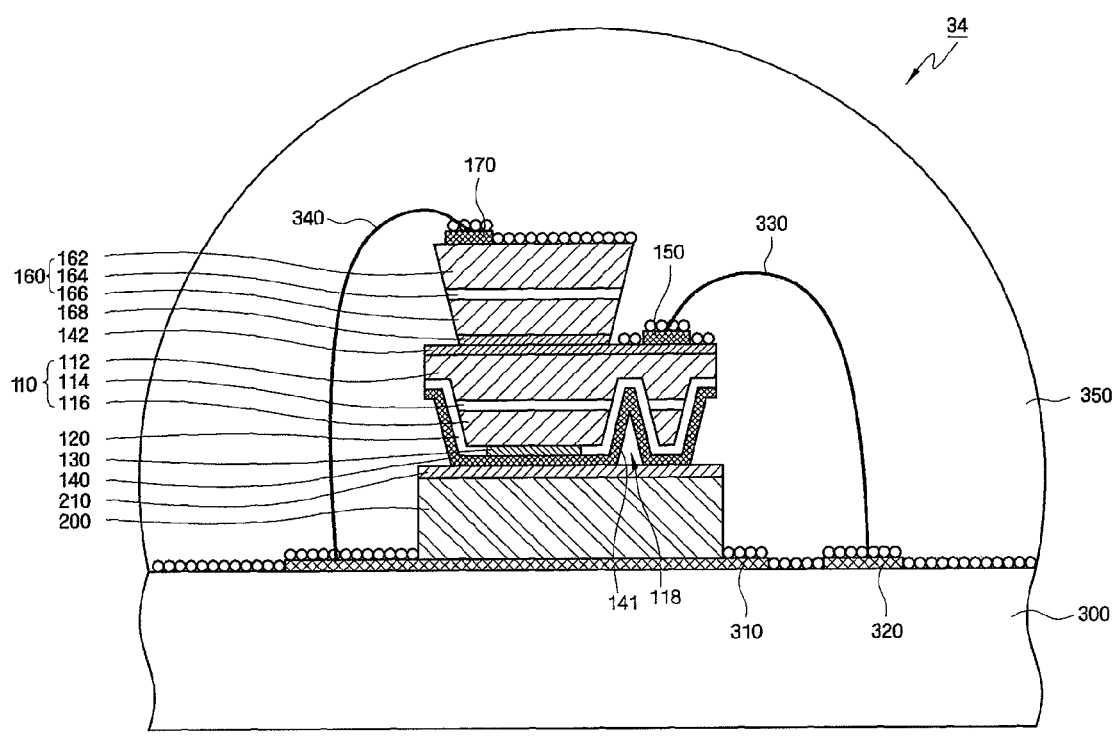
FIG. 11 shows a luminous package according to an exemplary embodiment of the present invention.

FIG. 11 shows a luminous package according to an exemplary embodiment of the present invention. Referring to FIG. 11, a luminous package 34 includes the semiconductor package 31 encapsulated by the encapsulant 350. In an exemplary embodiment, the phosphor 344 can be disposed on the substrate 300, first and second conductive pads 320 and 310, first and second electrodes 150 and 170, and the third semiconductor layer 162. The phosphor 344 can be a single layer in an exemplary embodiment.

Figure 12:
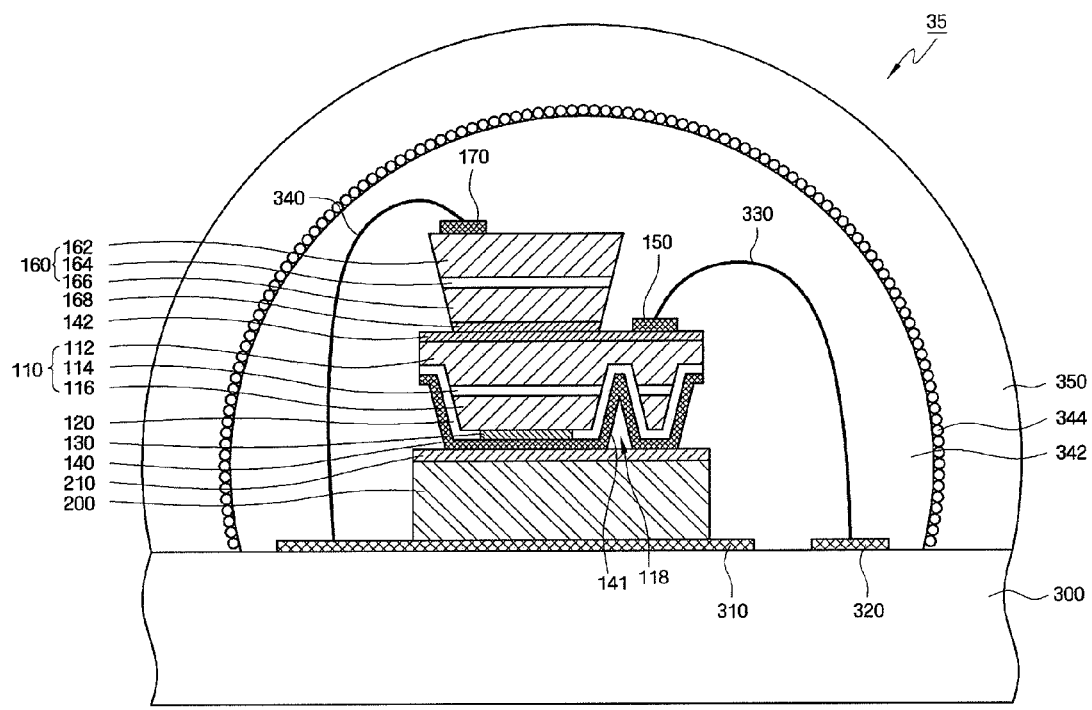
FIG. 12 shows a luminous package according to an exemplary embodiment of the present invention.

FIG. 12 shows a luminous package according to an exemplary embodiment of the present invention. Referring to FIG. 12, a luminous package 35 includes the semiconductor package 31 encapsulated by the first encapsulant 342 and the second encapsulant 350. In an exemplary embodiment, the phosphor 344 can be disposed for example, conformally, on the first encapsulant 342. The phosphor 344 can be a single layer in an exemplary embodiment.

Figure 13:
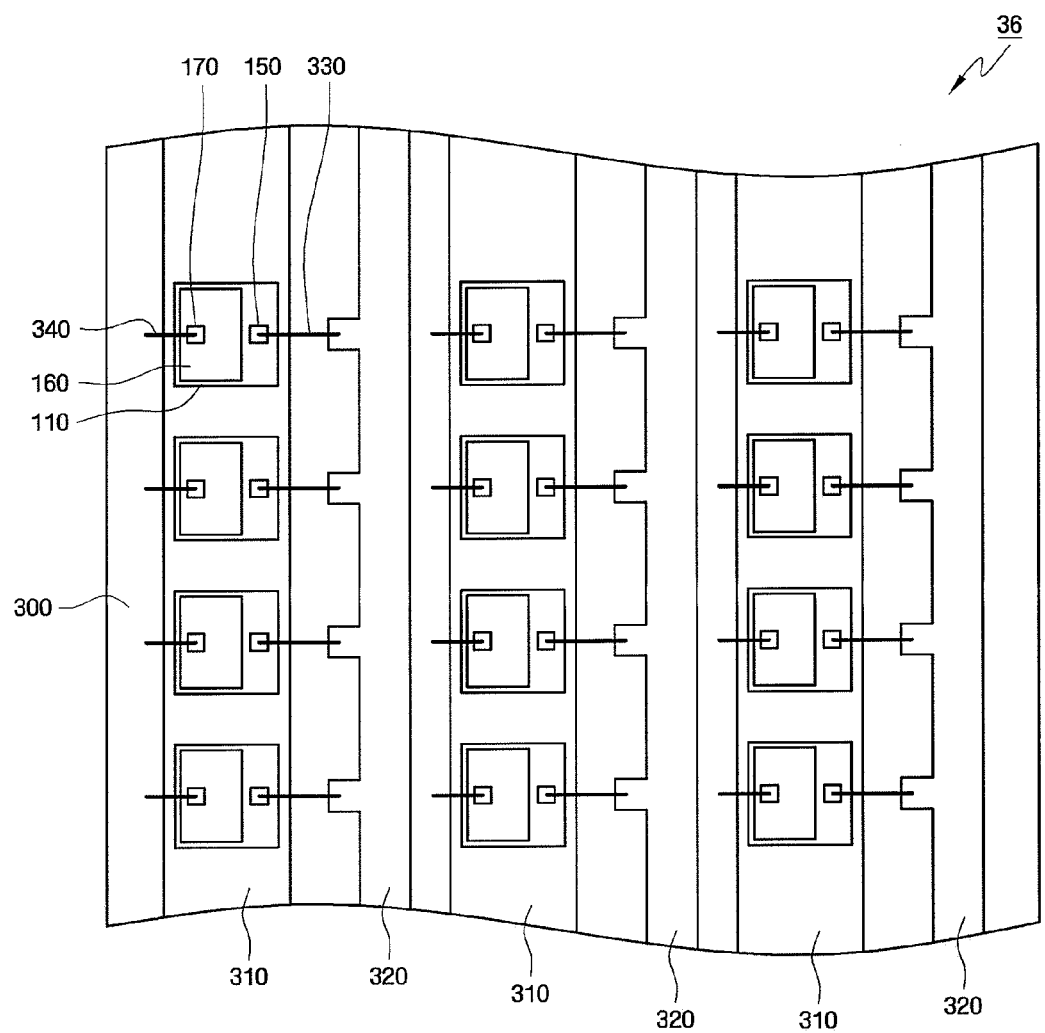
FIG. 13 shows an array of light emitting devices according to an exemplary embodiment of the present invention.

FIG. 13 is a plan view showing a luminous package module 36 according to an exemplary embodiment of the present invention. Referring to FIG. 13, the first conductive pad 320 is disposed adjacent to the second conductive pad 310 in a first column. In a second column next to the first column, another first conductive pad 320 and second conductive pad 310 are disposed. As such, a plurality of columns including the first and second conductive pads 320 and 310 are disposed to form a package array. In the first column, the second light emitting chip 160 is disposed on the first light emitting chip 110. The second electrode 170 is disposed on the second light emitting chip 160. The first electrode 150 is disposed on the first light emitting chip 110. The first wire 330 connects the first electrode 150 and the first conductive pad 320. The second wire 340 connects the second electrode 170 and the second conductive pad 310.

Figure 14:
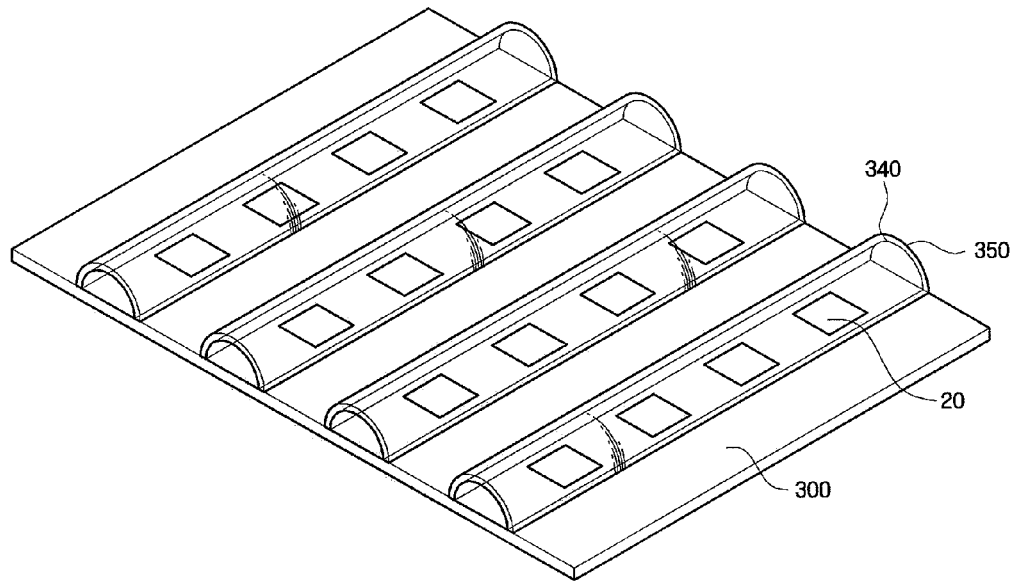
FIG. 14 shows a light emitting device in a package according to an exemplary embodiment of the present invention.

FIG. 14 is a perspective view showing a luminous package module according to an exemplary embodiment of the present invention. In a first column, a plurality of light emitting devices 20 disposed on the substrate 300 are arranged, for example, in a regular interval. The plurality of light emitting devices 20 are encapsulated by the first and second encapsulants 342 and 350 having an elongated tube shape cut in half. A second column including the plurality of light emitting devices 20 and the first and second encapsulants 342 and 350 can be disposed next to the first column with an interval therebetween. In this exemplary embodiment, more than one light emitting device 20 can be encapsulated by the first and second encapsulants 342 and 350.

Figure 15:
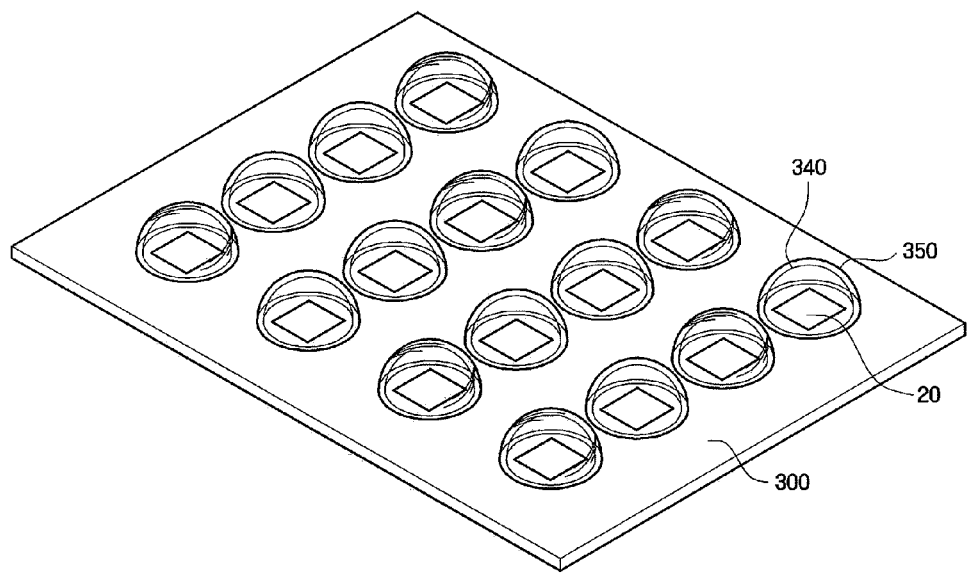
FIG. 15 shows a light emitting device in a package according to an exemplary embodiment of the present invention.

FIG. 15 is a perspective view showing a luminous package module according to an exemplary embodiment of the present invention. In a first column, a plurality of light emitting devices 20 disposed on the substrate 300 are arranged, for example, in a regular interval. Each of the plurality of light emitting devices 20 is respectively encapsulated by the first and second encapsulants 342 and 350. In an exemplary embodiment, the first and second encapsulants 342 and 350 can be a substantially hemisphere shape.

Figure 16:
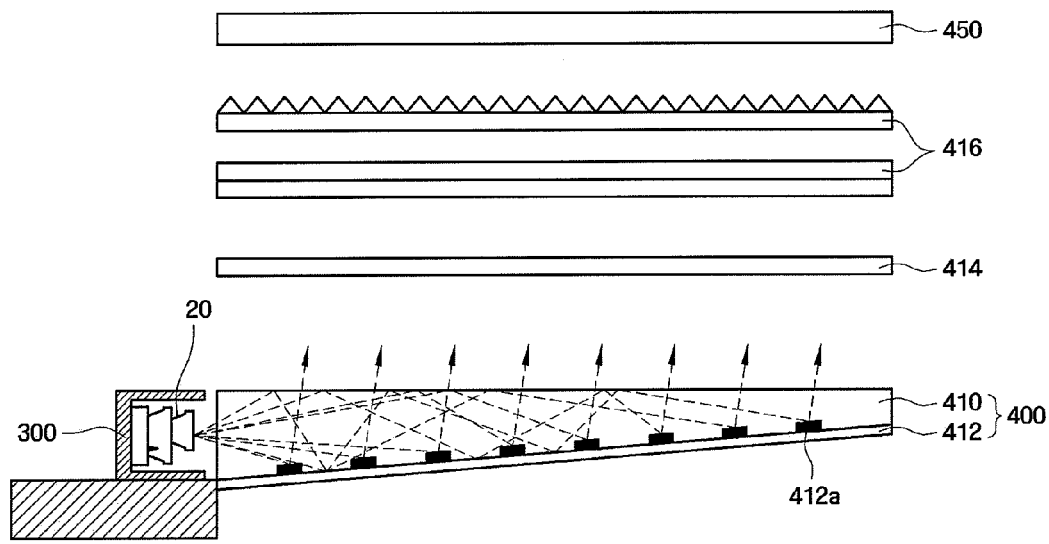
FIG. 16 shows a system including a light emitting device according to an exemplary embodiment of the present invention.

FIG. 16 is a cross-sectional view of a backlight unit according to an exemplary embodiment of the present invention. In an exemplary embodiment, an edge type backlight unit can be used. The light emitting device 20 disposed on the substrate 300 is located at an edge of a light guiding plate 400. The light guiding plate 400 includes a transfer sheet 410 disposed on a reflective sheet 412. A plurality of reflective patterns 412a can be disposed on the reflective sheet 412. A display panel 450 can be disposed on a spreading sheet 414 with prism sheets 416 positioned therebetween. The spreading sheet 414 spreads light received from the light guiding plate 400 and can be disposed on the light guiding plate 400. The prism sheets 416 can comprise two sheets and guide light to the display panel 450 in an orthogonal direction.

Figure 17:
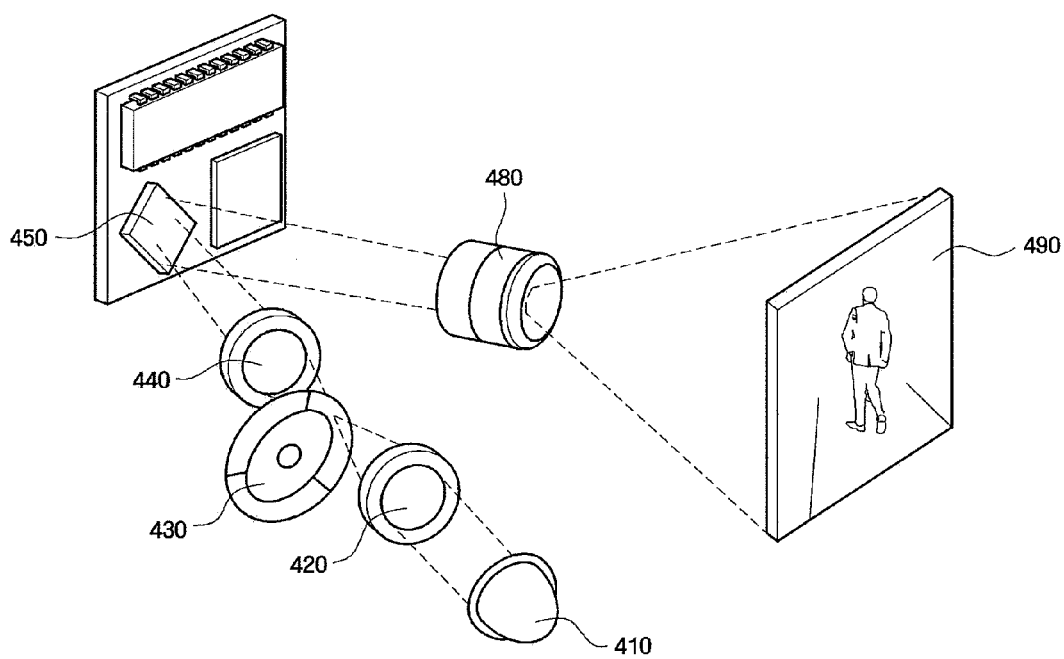
FIG. 17 shows a system including a light emitting device according to an exemplary embodiment of the present invention.
Figure 18:
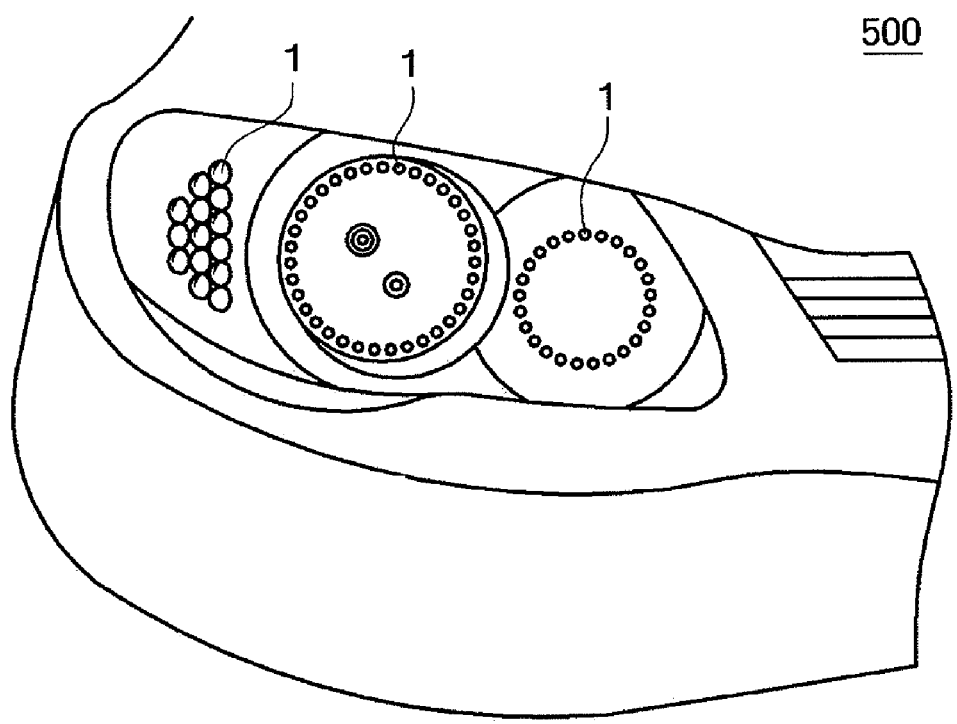
FIG. 18 shows a system including a light emitting device according to an exemplary embodiment of the present invention.
Figure 19:
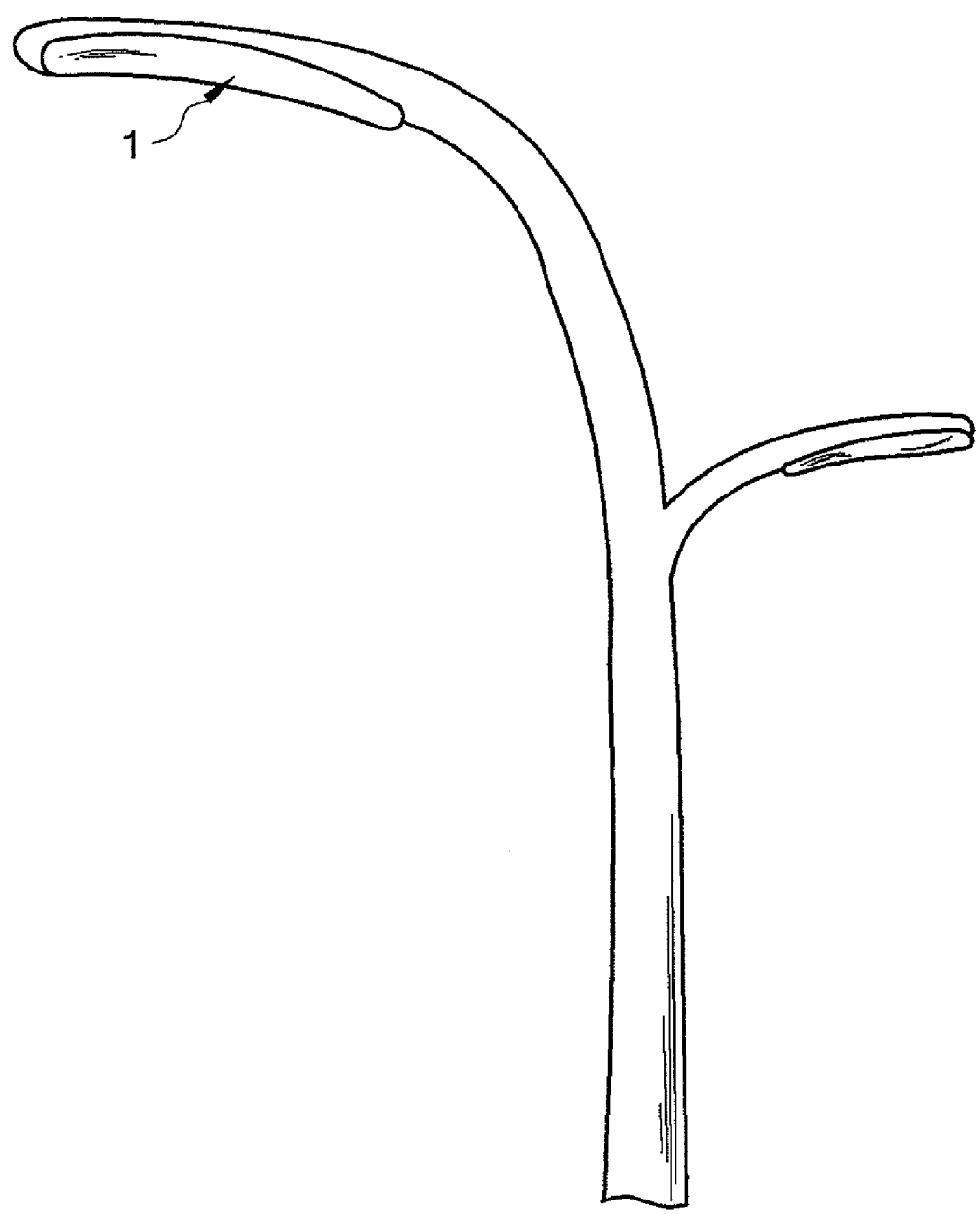
FIG. 19 shows a system including a light emitting device according to an exemplary embodiment of the present invention.
Figure 20:
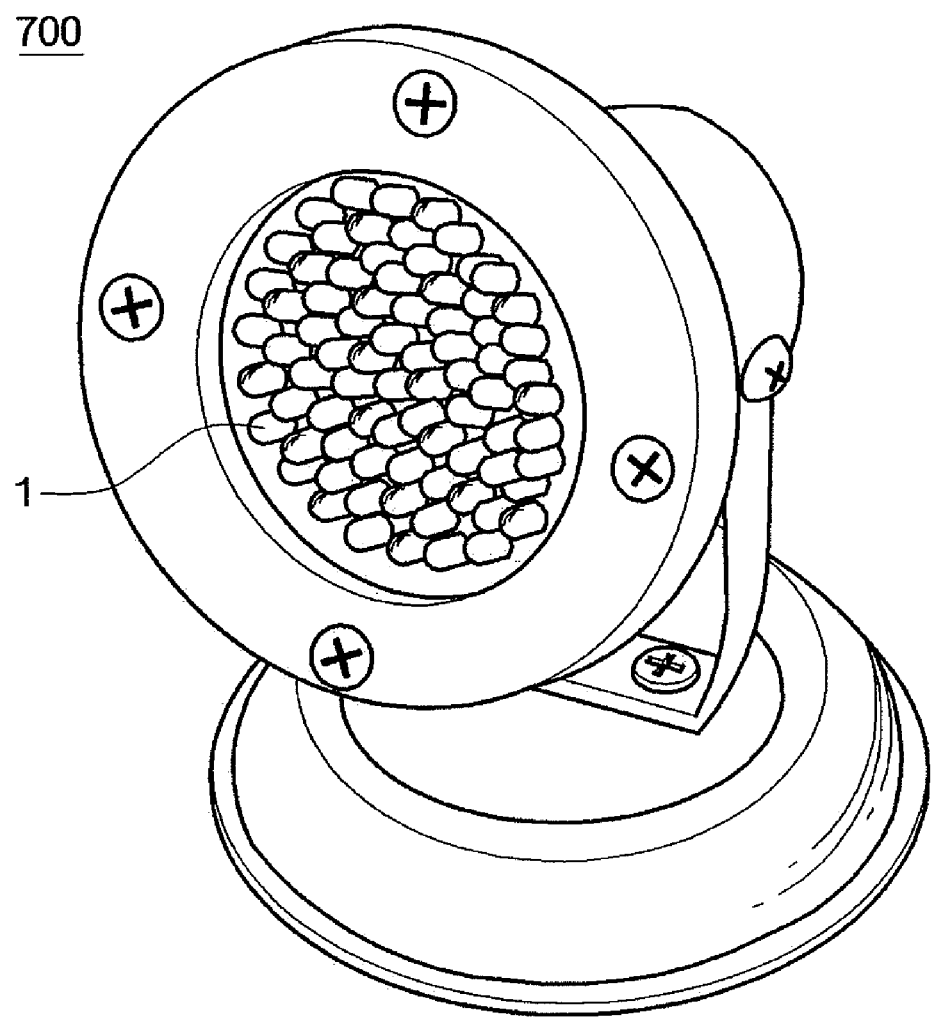
FIG. 20 shows a system including a light emitting device according to an exemplary embodiment of the present invention.

FIGS. 17, 18, 19 and 20 are systems using a light emitting device according to exemplary embodiments of the present invention. Referring to FIG. 17, the light emitting device is used in connection with a projector. The projector includes a light source 410, a condensing lens 420, a color filter 430, a sharpening lens 440, and a digital micromirror device (DMD) 450 arranged in a substantially in a line. A microlens 480 receives light from the DMD 450 and projects an image on the screen 490. Referring to FIG. 18, a plurality of luminous packages 1 are used as a light source for a vehicle 500. Referring to FIG. 19, a luminous package 1 according to an exemplary embodiment is used as a light source for a street lamp 600. Referring to FIG. 20, the plurality of luminous packages 1 according to an exemplary embodiment is used as a light source for an illumination lamp 700.

FIGS. 21 through 27 show a method of forming a light emitting device according to an exemplary embodiment of the present invention.

Figure 21A:
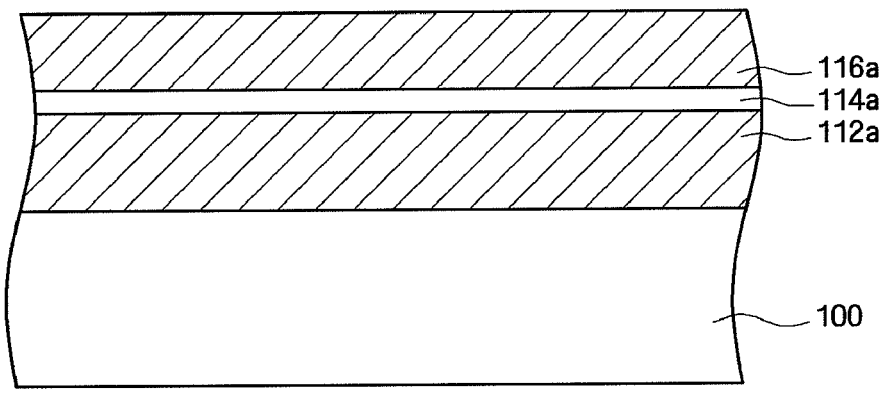
FIGS. 21(A), 21(B), 22(A), 22(B), 23(A), 23(B), 24, 25(A), 25(B), 26, and 27 show a method of forming a light emitting device according to an exemplary embodiment of the present invention.

Referring to FIG. 21(A), a first preliminary semiconductor layer 112a is formed on the first substrate 100. The second preliminary semiconductor layer 116a can be formed on the first preliminary semiconductor layer 112a with a first preliminary active layer 114a disposed therebetween. In an exemplary embodiment, a buffer layer can be formed between the first semiconductor layer 112a and the first substrate 100. The buffer layer can increase crystal characteristics of the first preliminary semiconductor layer 112a, the first preliminary active layer 114a, and the second preliminary semiconductor layer 116a.

The first preliminary semiconductor layer 112a, the first preliminary active layer 114a, and the second preliminary semiconductor layer 116a can comprise $In_xAl_yGa(1-x-y)N$ ($0 \leq x \leq 1$, $0 \leq y \leq 1$) such as, for example, AlGaN or InGaN. The preliminary semiconductor layers 112a and 116a can be formed on the first substrate 100 by, for example, metal organic chemical vapor deposition (MOCVD), liquid phase epitaxial growth, hydride vapor phase epitaxial growth, molecular beam epitaxial growth or metal organic vapor phase epitaxial growth. When the first preliminary semiconductor layer 112a is a first conductive type, the second preliminary semiconductor layer 116a can be a second conductive type. For example, when the first preliminary semiconductor layer 112a is an n-type semiconductor layer, the second preliminary semiconductor layer 116a can be a p-type semiconductor layer. For example, when the first preliminary semiconductor layer 112a is a p-type semiconductor layer, the second preliminary semiconductor layer 116a can be an n-type semiconductor layer.

In the preliminary active layer 114a, light recombination between electrons and holes occurs. The preliminary active layer 114a can comprise at least one potential well and a potential barrier. To adjust light emitting characteristics, at least one of B, P, Si, Mg, Zn and Se can be doped in the potential well and/or the potential barrier according to an exemplary embodiment of the present invention.

A heat treatment of about 400° C. can be performed to activate the second preliminary semiconductor layer 116a. For example, the second preliminary semiconductor 116a can have improved p-type characteristics through the heat treatment when the second preliminary semiconductor layer 116a is $In_xAl_yGa(1-x-y)N$ doped with Mg because H bonded to Mg can be separated from the Mg. In an exemplary embodiment, the first substrate 100 may comprise a dielectric material such as, for example, sapphire ($Al_2O_3$), ZnO or a conductor such as, for example, a Si or SiC.

Figure 21B:
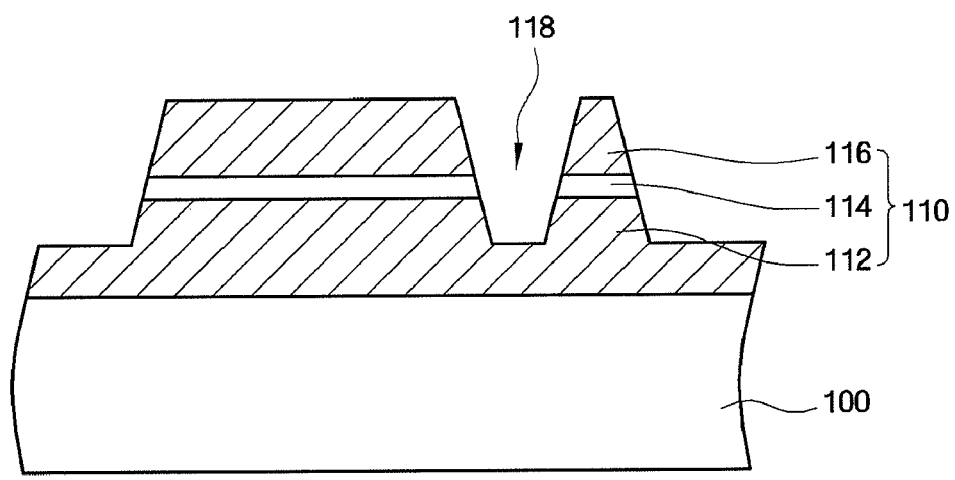

Referring to FIG. 21(B), the first active layer 114, the first semiconductor layer 112, the second semiconductor layer 116, and a groove 118 can be formed by patterning the first preliminary semiconductor layer 112a, the first preliminary active layer 114a, and the second preliminary semiconductor layer 116a. The groove 118 has inclined surfaces which can be used to reflect light emitted from the active layers 114 and 164 according to an exemplary embodiment of the present invention.

Figure 22A:
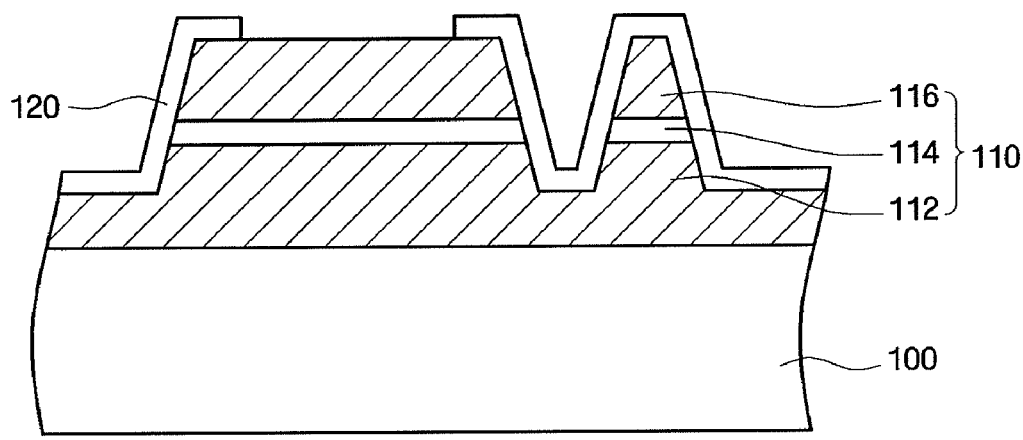

Referring to FIG. 22(A), an insulator 120 can be formed on the first and second semiconductor layers 112 and 116 and the active layer 114. That is, the insulator 120 can be conformally formed on the recessed and protruding portion of the first light emitting chip 110. A part of the top surface of the second semiconductor layer 116 can be exposed. The insulator 120 can comprise, for example, SiO, SiN, SiON, $Al_2O_3$, or AlN.

Figure 22B:
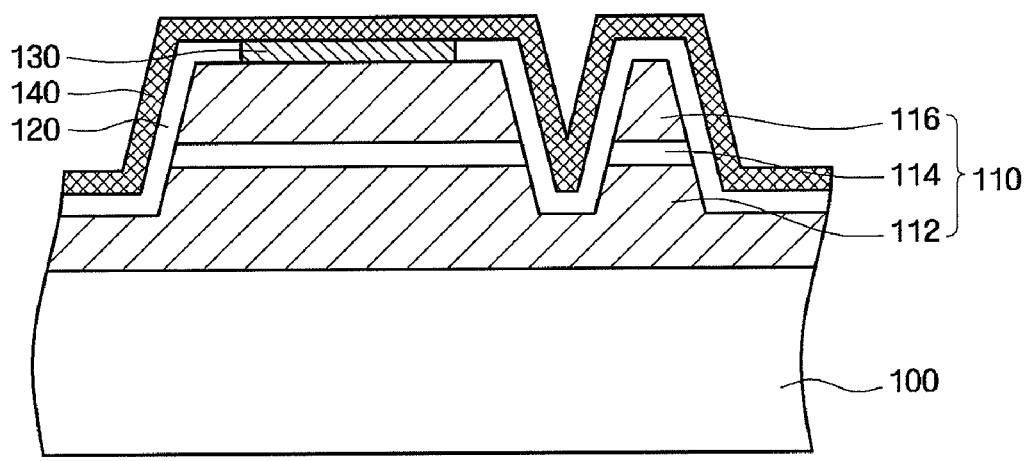

Referring to FIG. 22(B), the third ohmic layer 130 is formed on the exposed portion of the second semiconductor layer 116. The third electrode 140 can be formed on the insulator 120 and on the third ohmic contact layer 130. That is, the third electrode 140 can be conformally formed on the top surface and sidewall of the first light emitting chip 110. In an exemplary embodiment, the third electrode 140 can comprise a material with a high reflectivity such as, for example, Ag or Al. The ohmic contact layer 130 can comprise, for example, at least one of indium tin oxide (ITO), Zn, ZnO, Ag, Ti, Al, Au, Ni, $In_2O_3$, $SnO_2$, Cu, W or Pt. A heat treatment using a heat of about 400° C. can be performed to activate the third ohmic contact layer 130. The third ohmic contact layer 130 disposed between the third electrode 140 and the second semiconductor layer 116 can increase the current spreading.

Figure 23A:
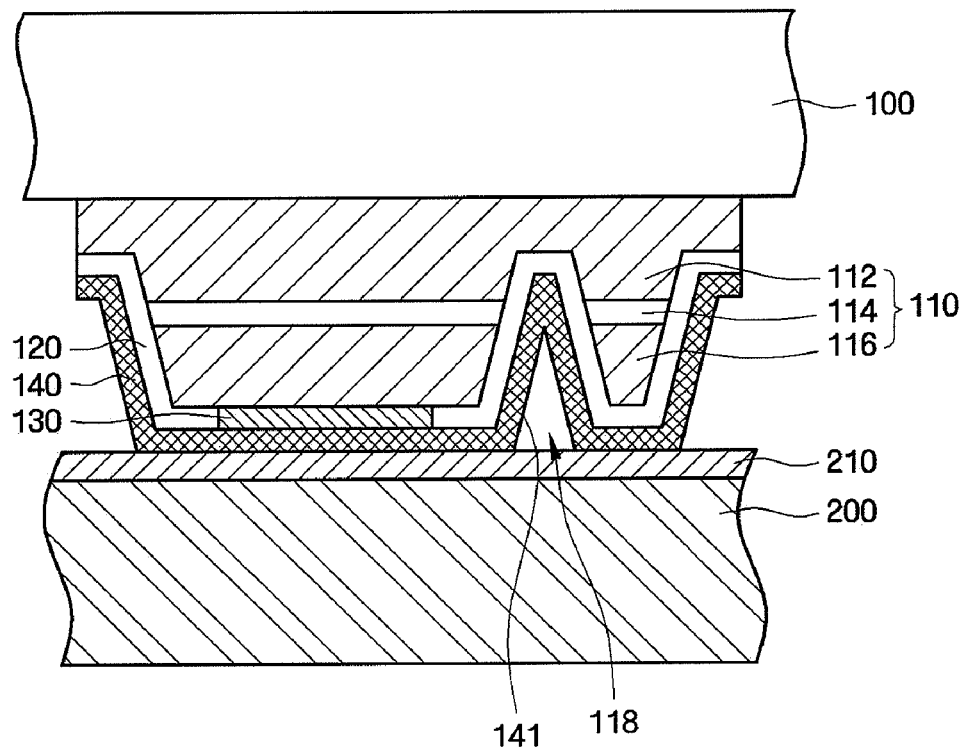

Referring to FIG. 23(A), the second substrate 200 can be formed on the third electrode 140 with the intermediate layer 210 disposed therebetween. As such, the first and second substrates 100 and 200 are bonded with each other. The second substrate 200 can be a conductive substrate. The second substrate 200 may comprise, for example, Si, strained Si, Si alloy, SOI, SiC, SiGeC, Ge, Ge alloy, GaAs, InAs, or III-V semiconductor. The intermediate layer 210 can comprise, for example, at least one of Au, Ag, Pt, Ni, Cu, Sn, Al, PB, Cr, or Ti. The intermediate layer 210 can have a lower reflective index than the third electrode 140. When the intermediate layer 210 comprises Au, the first and second substrates 100 and 200 can be bonded with each other by a thermal process using heat of about 200° C. to about 450° C. In an exemplary embodiment, a pressure process can be added in the thermal process.

Figure 23B:
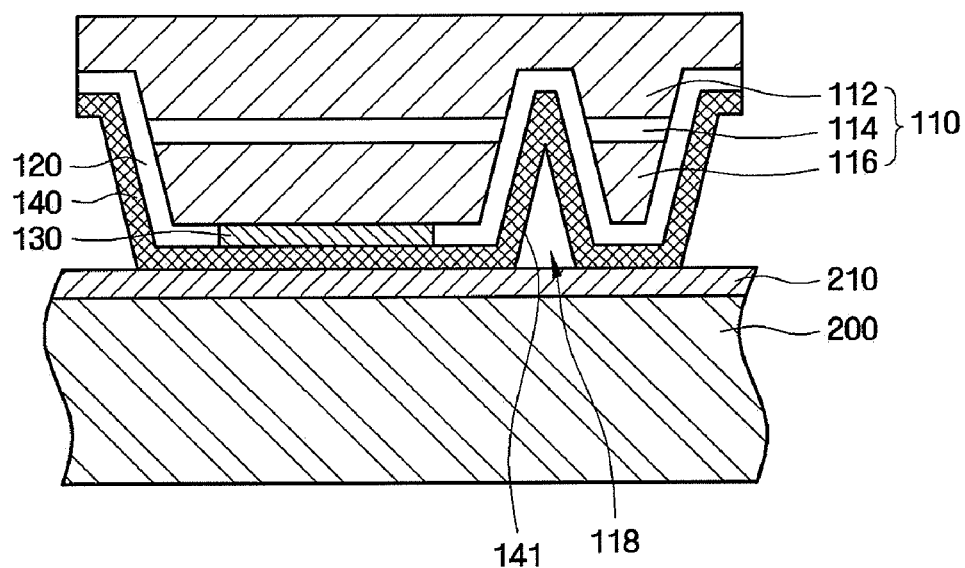

Referring to FIG. 23(B), the first substrate 100 is removed from the first semiconductor layer 112. In an exemplary embodiment, laser can be used to remove the first substrate 100. For example, the laser melts the buffer layer or n-GaN formed between the first substrate 100 and the first semiconductor layer 112 such that the first substrate 100 can be separated from the first semiconductor layer 112. In an exemplary embodiment, a thinning process including a CMP, grinding, or etch back process can be performed before removing the first substrate 100 to prevent damage to the first light emitting device 110.

Figure 24:
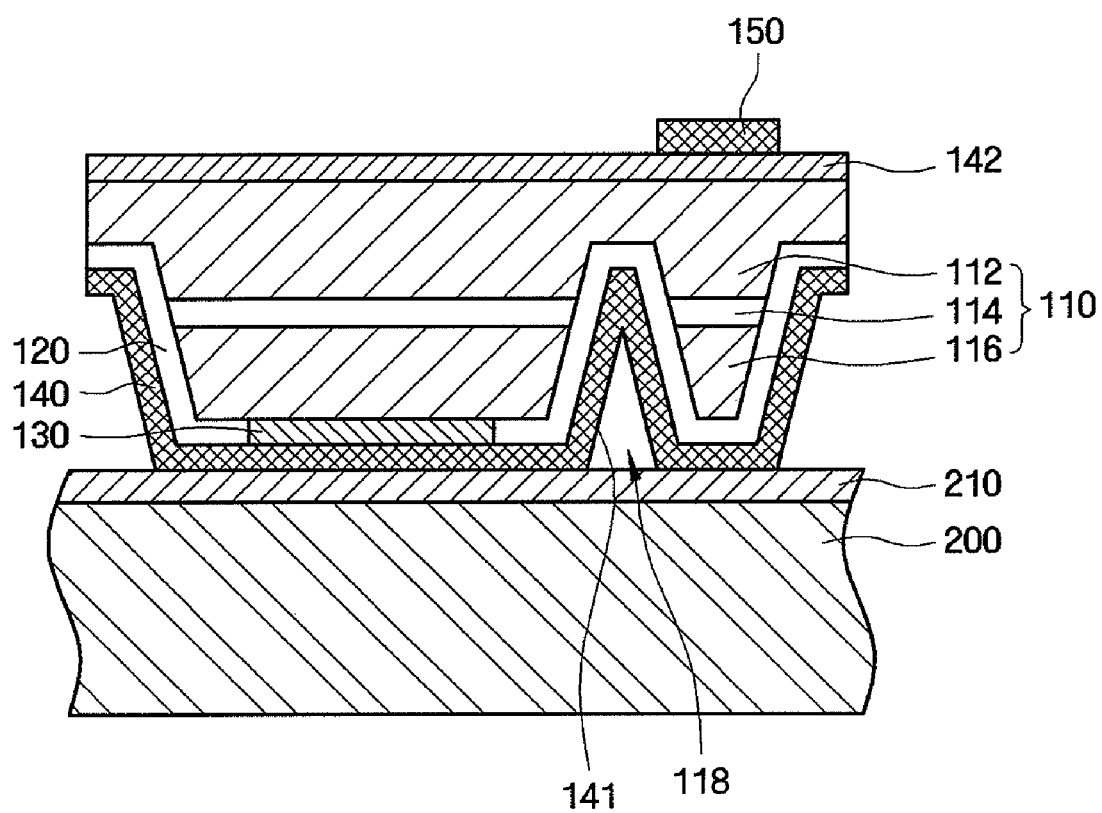

Referring to FIG. 24, the first ohmic contact layer 142 is formed on the first semiconductor layer 112. The first electrode 150 is formed on the first ohmic contact layer 142. In an exemplary embodiment, the first electrode 150 can be formed on near an edge of the first ohmic contact layer 142 such that the second light emitting chip 160 can be disposed on the first ohmic contact layer 142 without contacting the first electrode 150. The first ohmic contact layer 142 may comprise, for example, ITO, Zn, ZnO, Ag, Ti, Al, Au, Ni, $In_2O_3$, $SnO_2$, Cu, W or Pt. The first electrode 150 may comprise, for example, ITO, Cu, Ni, Cr, Au, Ti, Pt, Al, V, W, Mo or Ag. The first ohmic contact layer 142 can increase the current spreading passing though the first and second light emitting chips 110 and 160.

Figure 25A:
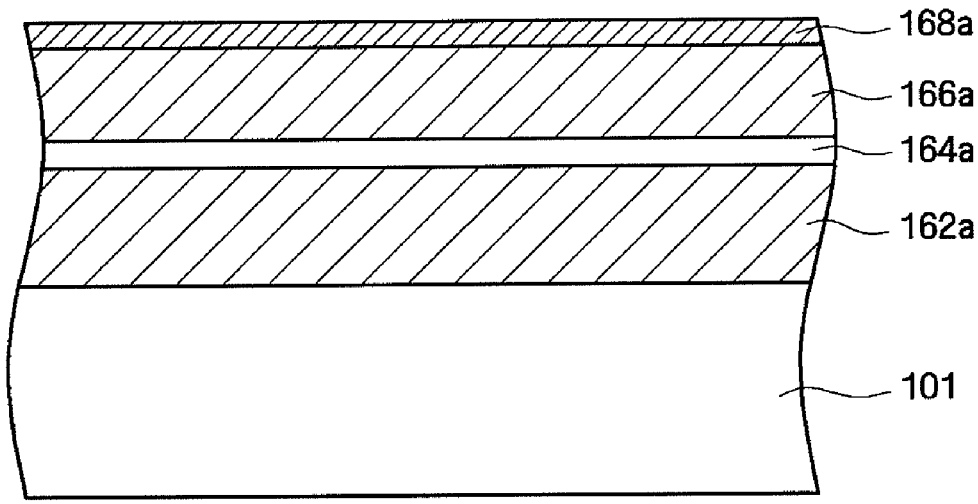

Referring to FIG. 25(A), the third preliminary semiconductor layer 162a is formed on a third substrate 101. A fourth preliminary semiconductor layer 166a is formed on the third preliminary semiconductor layer 162a with a second preliminary active layer 164a disposed therebetween. The second preliminary ohmic contact layer 168a is formed on the fourth preliminary semiconductor layer 166a.

Figure 25B:
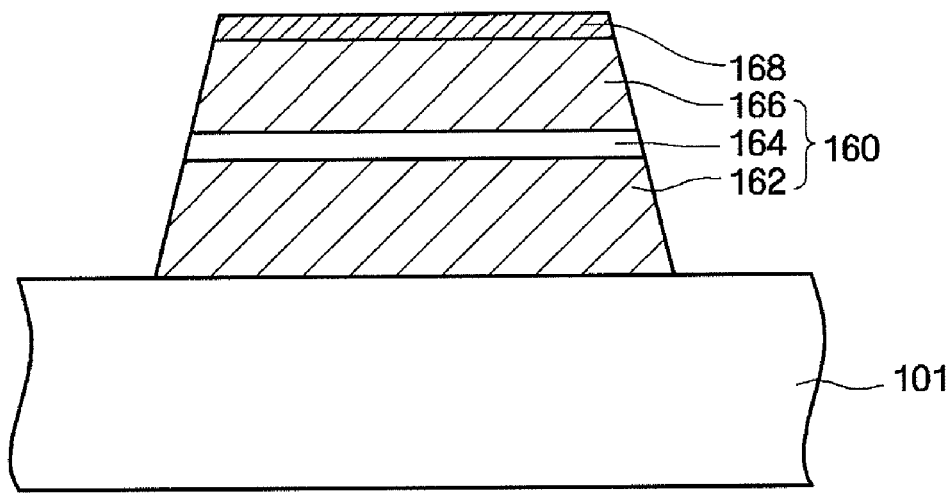

Referring FIG. 25(B), the second light emitting chip 160 is formed by patterning the third preliminary semiconductor layer 162a, the fourth preliminary semiconductor layer 166a, the second preliminary active layer 164a, and the second preliminary active layer 164a. In an exemplary embodiment, the first light emitting chip 110 except for a portion overlapped with the first electrode 150 has a substantially the same shape as the second light emitting chip 160.

Figure 26:
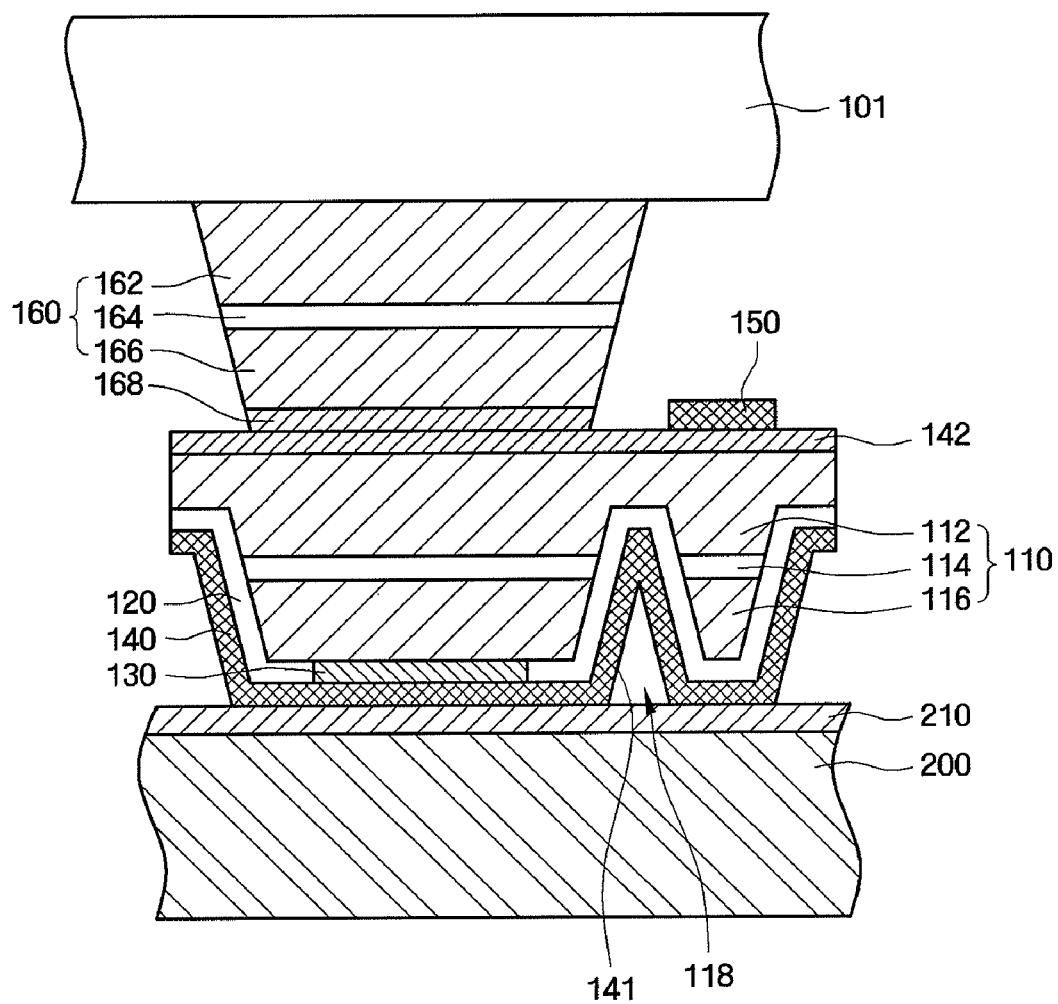

Referring to FIG. 26, the second light emitting chip 160 disposed on the third substrate 101 is bonded together with the first light emitting chip 110 disposed on the second substrate 200. That is, the first ohmic contact layer 142 disposed on the first light emitting chip 110 contacts the second ohmic contact layer 168 disposed the second light emitting chip 160. As such, the first semiconductor layer 112 and the fourth semiconductor layer 166 are electrically connected thorough the first and second ohmic contact layers 142 and 168.

Figure 27:
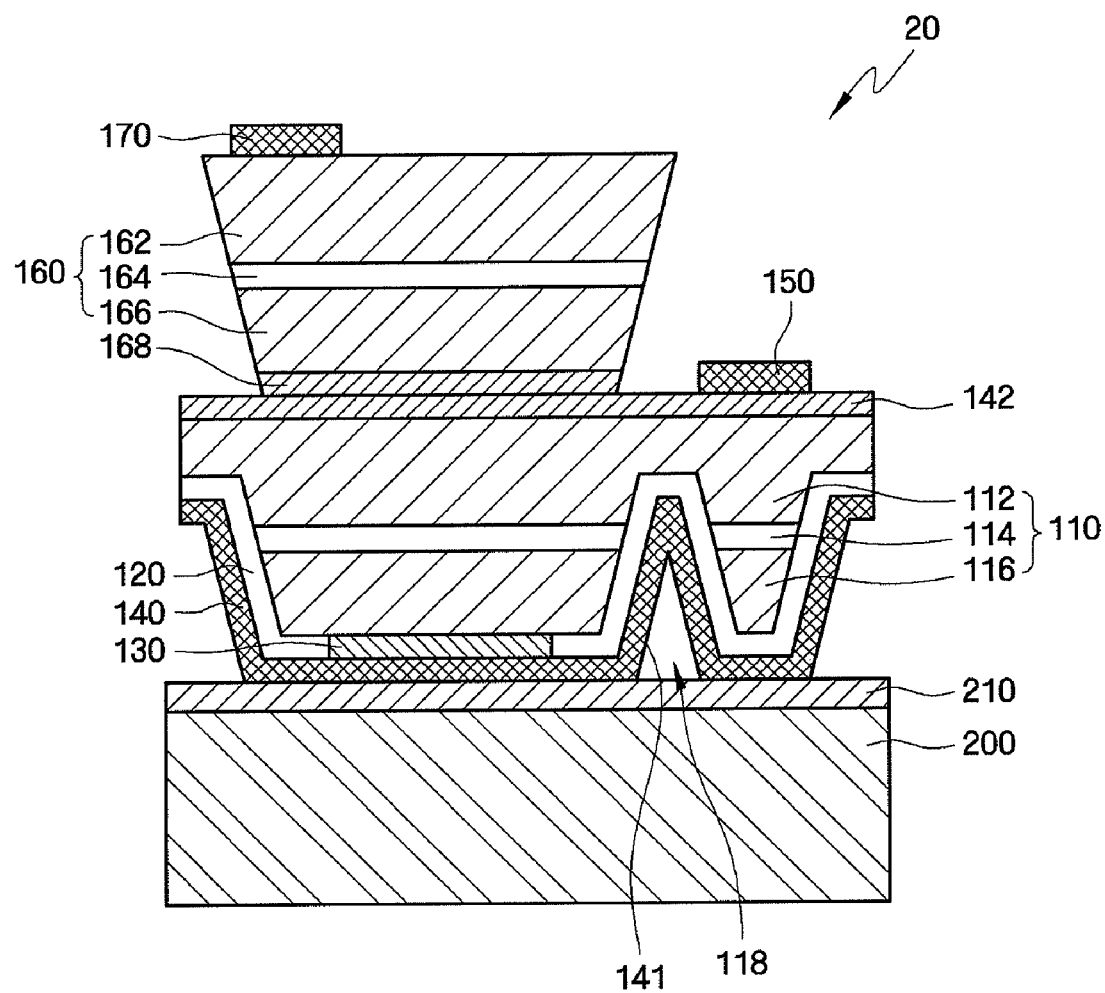

Referring to FIG. 27, the third substrate 101 is removed from the second light emitting chip 160. The second electrode 170 can be formed on the third semiconductor layer 162.

Exemplary embodiments of the present invention provide a light emitting device having at least two LED chips stacked one over another. The light emitting device can operate on AC power. The two LED chips are electrically connected with a conductive material disposed therebetween. As such, a number of the electrodes and wires connecting the two LED chips in the light emitting device can be minimized.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor device comprising:
 a first light emitting chip, the first light emitting chip having a first semiconductor layer, a second semiconductor layer, and a first active layer disposed therebetween;
 a second light emitting chip disposed on the first light emitting chip, the second light emitting chip having a third semiconductor layer, a fourth semiconductor layer, and a second active layer disposed therebetween; and
 a conductive layer disposed between the first semiconductor layer and the fourth semiconductor layer, the first semiconductor layer and the fourth semiconductor layer having different conductivity types.

2. The semiconductor device of claim 1, further comprising a first electrode disposed on the conductive layer, a second electrode disposed on the third semiconductor layer, and a third electrode disposed on the second semiconductor layer.

3. The semiconductor device of claim 2, wherein the second electrode and the third electrode are electrically connected.

4. The semiconductor device of claim 1, wherein the second semiconductor layer is disposed on a substrate.

5. The semiconductor device of claim 4, wherein the substrate comprising at least one of a semiconductor material or a conductive material.

6. The semiconductor device of claim 1, wherein the conductive layer is transparent.

7. The semiconductor device of claim 1, wherein the conductive layer is reflective.

8. The semiconductor device of claim 2, wherein the third electrode is reflective.

9. The semiconductor device of claim 8, wherein the third electrode includes a reflective side wall.

10. The semiconductor device of claim 7, wherein the third electrode is flat.

11. The semiconductor device of claim 1, further comprising vias disposed between the fourth semiconductor layer and the conductive layer.

12. The semiconductor device of claim 1, wherein the second light emitting chip is a vertical type emitting chip.

13. The semiconductor device of claim 1, further comprising a third light emitting chip including a fifth semiconductor layer, the fifth semiconductor layer disposed on the third semiconductor layer, the fifth semiconductor layer and the third semiconductor layer having different conductive types.

14. The semiconductor device of claim 1, further comprising a third light emitting chip including a fifth semiconductor layer, the fifth semiconductor layer disposed on the third semiconductor layer, the fifth semiconductor layer and the third semiconductor layer having the same conductive type.

15. The semiconductor device of claim 1, wherein the first and second light emitting chips configured to be alternately energized on respective alternating halves of an AC waveform to emit light.

16. The semiconductor device of claim 1, wherein a contour of the first light emitting chip overlapping the second light emitting chip is substantially the same as a contour of the second light emitting chip.

* * * * *